(12) United States Patent
Zhang et al.

(10) Patent No.: US 10,622,518 B1
(45) Date of Patent: Apr. 14, 2020

(54) LIGHT-EMITTING DIODE WITH A MESA CONSTRUCTED FROM A UNIT CELL

(71) Applicant: BOLB INC., San Jose, CA (US)

(72) Inventors: Jianping Zhang, San Jose, CA (US); Ling Zhou, San Jose, CA (US); Alexander V. Lunev, San Jose, CA (US); Ying Gao, San Jose, CA (US)

(73) Assignee: BOLB INC., San Jose, CA (US)

( * ) Notice: Subject to any disclaimer, the term of this patent is extended or adjusted under 35 U.S.C. 154(b) by 0 days.

(21) Appl. No.: 16/218,381

(22) Filed: Dec. 12, 2018

(51) Int. Cl.
*H01L 33/24* (2010.01)
*H01L 33/32* (2010.01)
*H01L 33/38* (2010.01)
*H01L 31/173* (2006.01)
*H01L 33/00* (2010.01)

(52) U.S. Cl.
CPC ............ *H01L 33/24* (2013.01); *H01L 31/173* (2013.01); *H01L 33/0075* (2013.01); *H01L 33/32* (2013.01); *H01L 33/38* (2013.01)

(58) Field of Classification Search
CPC ....... H01L 33/24; H01L 31/173; H01L 33/32; H01L 33/0075; H01L 33/38
USPC .............................................. 257/79, 98, 91
See application file for complete search history.

(56) References Cited

U.S. PATENT DOCUMENTS

| | | | |
|---|---|---|---|
| 6,521,914 B2 | 2/2003 | Krames et al. | 257/81 |
| 6,603,152 B2 | 8/2003 | Song et al. | 257/99 |
| 6,958,498 B2 | 10/2005 | Shelton et al. | 257/99 |
| 7,462,868 B2 | 12/2008 | Li et al. | 257/79 |
| 7,573,074 B2 | 8/2009 | Shum et al. | 257/99 |
| 8,872,204 B2 * | 10/2014 | Yang | H01L 33/20 257/98 |
| 2007/0126013 A1 * | 6/2007 | Kim | H01L 33/08 257/91 |

OTHER PUBLICATIONS

Guo, X. et al., "Current crowding in GaN/InGaN light emitting diodes on insulating substrates" Journal of Applied Physics; vol. 90, No. 8; (Oct. 15, 2001); pp. 4191-4195.
Zhang, J. P. et al. "Milliwatt power deep ultraviolet light-emitting diodes over sapphire with emission at 278 nm" Applied Physics Letters; vol. 81, No. 26; (Dec. 23, 2002); pp. 4910-4912.

* cited by examiner

*Primary Examiner* — Caleen O Sullivan
(74) *Attorney, Agent, or Firm* — J.C. Patents

(57) ABSTRACT

A light-emitting device includes an n-semiconductor structure, a p-semiconductor structure and a light-emitting active-region sandwiched therebetween. An n-trough is formed to expose the n-semiconductor structure by removing a first portion of the p-semiconductor structure and the light-emitting active-region. The n-trough surrounds a p-mesa which contains a second portion of the n-semiconductor structure, the p-semiconductor structure and the light-emitting active-region. The n-trough and the p-mesa are path-connected spaces and are formed via lithography and etching using a lithographic mask which is topologically constructed via merging a unit cell's at least two transformations selected from the unit cell's translation, rotation, and reflection transformations.

13 Claims, 26 Drawing Sheets

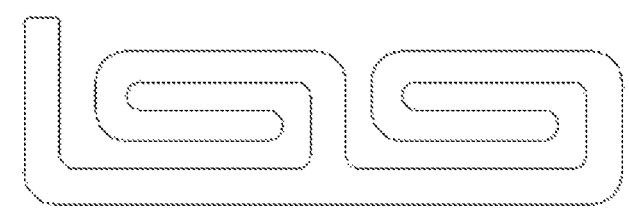
FIG. 2A — Double m (m²)
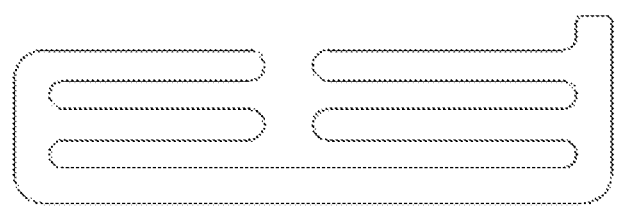
FIG. 2B — E
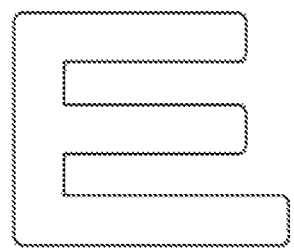
FIG. 2C — E'
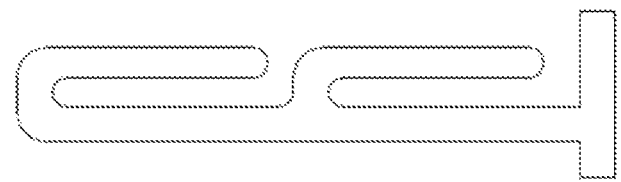
FIG. 2D — Double C (C²)
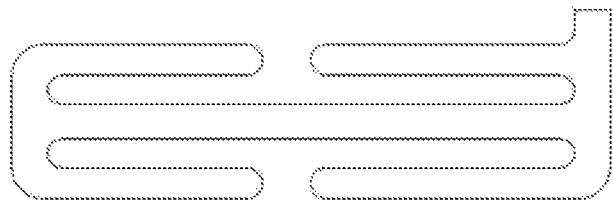
FIG. 2E — Double G (G²)

LIGHT-EMITTING DIODE WITH A MESA CONSTRUCTED FROM A UNIT CELL

1. FIELD OF THE INVENTION

The present disclosure relates in general to semiconductor light emitting technology and, more particularly, to light-emitting diode with a mesa constructed from a unit cell and the formation of mesa structures with uniform current injection to light-generating layers of light-emitting devices.

2. DESCRIPTION OF THE RELATED ART

Nitride compound semiconductors such as InN, GaN, AlN, and their ternary and quaternary alloys depending on alloy composition enable ultraviolet (UV) emissions ranging from 410 nm approximately to 200 nm. These include UVA (400-315 nm), UVB (315-280 nm), and part of UVC (280-200 nm) emissions. UVA emissions are leading to revolutions in curing industry, and UVB and UVC emissions owing to their germicidal effect are looking forward to general adoption in food, water, and surface disinfection businesses. Compared to the traditional UV light sources, such as mercury lamps, UV light emitters made of nitride compounds offer intrinsic merits. In general, nitride UV emitters are robust, compact, spectrum adjustable, and environmentally friendly. They offer high UV light intensity and dosage, facilitating an ideal disinfection/sterilization treatment for water, air, food and object surface. Further, the light output of nitride UV light emitters can be modulated at high frequencies up to a few hundreds of mega-hertz, promising them to be innovative light sources for Internet of Things, covert communications and bio-chemical detections.

Referring to FIG. 1B, the state-of-the-art UV light-emitting diodes (LEDs) commonly adopt a laminate structure containing a substrate 10', an n-type AlGaN (n-AlGaN) structure 20', an AlGaN-based multiple quantum well (MQW) active-region 30', and a p-type AlGaN (p-AlGaN) structure 40'. The n-AlGaN and p-AlGaN structures (20' and 40') respectively inject electrons and holes into MQW active-region 30' for light-generation. An AlGaN structure may consist of a few AlGaN layers formed as a structure to perform better functionalities than a single AlGaN layer. For example, an AlGaN structure can be made of a few AlGaN layers of different doping levels and/or of different composition profiles so as to have better electrical conductivity and carrier confinement. Substrate 10' can be made of UV-transparent c-plane sapphire or AlN. An AlN layer can be optionally coated over substrate 10' serving as epitaxy template, together with sets of AlN/AlGaN superlattices for dislocation and strain management (not shown in FIG. 1B). The utilization of AlN template and AlN/AlGaN superlattice enables growth of high-quality high-conductivity n-AlGaN structure 20', which serves as electron supplier layer and injects electrons into the following MQW active-region 30'. A conventional AlGaN UV LED structures can be found in the reference. (e.g., "Milliwatt power deep ultraviolet light-emitting diodes over sapphire with emission at 278 nm", J. P. Zhang, et al, APPLIED PHYSICS LETTERS 81, 4910 (2002), the content of which is incorporated herein by reference in its entirety.).

To extract light out from substrate side these UV LEDs inevitably adopt insulating materials such as sapphire or AlN as substrate, which excludes the possibility of forming n-contact on substrate 10', leaving n-AlGaN structure (20') the only suitable place for n-contact formation. This demands that substrate 10' has to be lifted off or partial of the epitaxial laminate structure has to be removed, to gain access to n-AlGaN structure (20'). Referring to the device shown in FIGS. 1A and 1B, per selective removal of some epitaxial layers, n-AlGaN structure 20' is partially exposed, and at least a trough, called n-trough 2', and a mesa, called p-mesa 1' are formed, and n-ohmic contact 51' is formed in n-trough 2' on the exposed area of n-AlGaN 20', with a further thick n-metal 52' overlying n-ohmic contact 51' to provide protection as well as better electrical conduction. An LED fabricated according to FIGS. 1A and 1B is called a lateral injection LED since electrons are injected laterally from n-ohmic contact 51' into n-AlGaN structure 20'.

In lateral injection LEDs, the limited electrical conduction of n-AlGaN structure 20' results in a deleterious effect called current crowding effect: current crowds at the edge of p-mesa 1' as illustrated in FIG. 1B. To distribute current more uniformly in a lateral injection LED, interdigital p and n electrodes are widely used, as seen from U.S. Pat. No. 6,521,914, U.S. Pat. Nos. 6,603,152, 6,958,498, 7,462,868, and 7,573,074. An example of interdigital electrode design in the prior art is shown in FIGS. 1A and 1B (FIG. 1B is the cross-sectional schematic taken from AA' cut in FIG. 1A). As seen, p-mesa 1' is formed of many parallel fingers, separated from each other by surrounding n-trough 2'. N-trough 2' is formed via selective removal of p-AlGaN structure 40', MQW active-region 30' and partial of n-AlGaN structure 20'. N-ohmic contact 51' is then formed in n-trough 2' on the exposed areas of n-AlGaN structure 20'. Overlying n-ohmic contact 51' is thick n-metal 52', providing larger current dissipation capability and protection to n-ohmic contact 51'. Formed on p-mesa 1' is p-ohmic contact 61', which is covered by thick p-metal 62' for protection and larger current handling capability. The whole LED can be passivated by passivation layer 70', leaving openings/windows such as opened n-contact pad 5' and opened p-contact pad 3' to form electrical connection to an external power source. Passivation layer 70' can be made of silicon dioxide, or silicon nitride, et al.

The prior art LED chip designs even though addressed the current crowding issue, however, haven't provided a complete solution. Even worse, the interdigital electrode design shown in FIG. 1A, with intention to mediate current crowding issue, brings in new issues such as near field and far field emission pattern non-uniformity, which is deleterious in optical fiber coupling and undesirable for disinfection and illumination applications.

The present disclosure provides solutions to reduce current crowding without introducing deleterious side effects.

3. SUMMARY

A light-emitting device is provided which includes an n-semiconductor structure, a p-semiconductor structure and a light-emitting active-region sandwiched therebetween;

wherein an n-trough is formed to expose the n-semiconductor structure by removing a first portion of the p-semiconductor structure and the light-emitting active-region, and the n-trough surrounds a p-mesa which contains a second portion of the n-semiconductor structure, the p-semiconductor structure and the light-emitting active-region;

wherein the n-trough and the p-mesa are path-connected spaces and are formed via lithography and etching using a lithographic mask which is topologically constructed via merging a unit cell and at least two of its three rigid transformations including translation, rotation, and reflection;

wherein the merging is a translation operation, via translating the unit cell and its transformations to allow for closest neighboring parallel portions to overlap, so as to form path-connected zero genus overlapped zones.

Also provided is a method for fabricating a light-emitting device having an n-through and a p-mesa, wherein the light-emitting device includes an n-semiconductor structure, a p-semiconductor structure and a light-emitting active-region sandwiched therebetween, and the n-trough is formed to expose the n-semiconductor structure by removing a first portion of the p-semiconductor structure and the light-emitting active-region, and the n-trough surrounds the p-mesa which contains a second portion of the n-semiconductor structure, the p-semiconductor structure and the light-emitting active-region; the method includes:

designing a pattern by performing on a unit cell at least two of three operations including translation, rotation, and reflection;

topologically constructing a lithographic mask with the pattern; and forming the n-trough and the p-mesa via lithography and etching using the lithographic mask.

4. BRIEF DESCRIPTION OF THE DRAWINGS

The accompanying drawings, which are included to provide a further understanding of the disclosure and constitute a part of this application, illustrate embodiments of the disclosure and together with the description serve to explain the principle of the disclosure. Like reference numbers in the figures refer to like elements throughout, and a layer can refer to a group of layers associated with the same function.

FIG. 2A shows a plan-view of a p-mesa unit cell ($m^2$) according to an embodiment of the present disclosure.

FIG. 2B shows a plan-view of a p-mesa unit cell (E) according to an embodiment of the present disclosure.

FIG. 2C shows a plan-view of a p-mesa unit cell (E') according to an embodiment of the present disclosure.

FIG. 2D shows a plan-view of a p-mesa unit cell ($C^2$) according to an embodiment of the present disclosure.

FIG. 2E shows a plan-view of a p-mesa unit cell ($G^2$) according to an embodiment of the present disclosure.

Figure 4A:
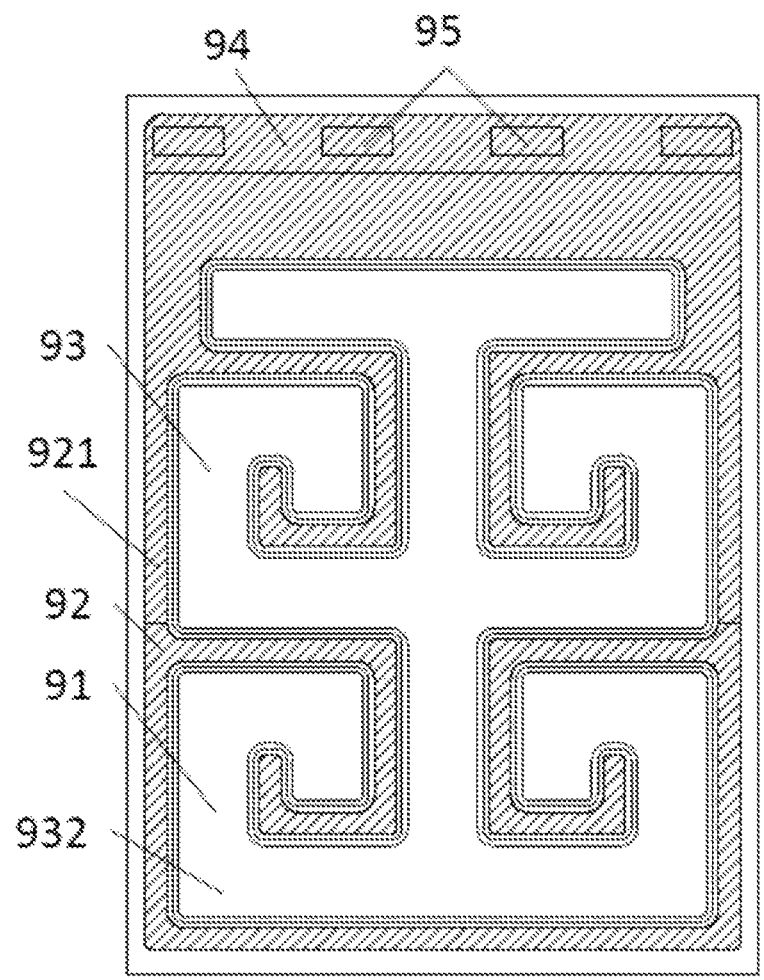
FIG. 4A illustrates a plan-view LED chip design, via operating a p-mesa unit cell G" at least through two of the three operators: translation, reflection and rotation.
Figure 4B:
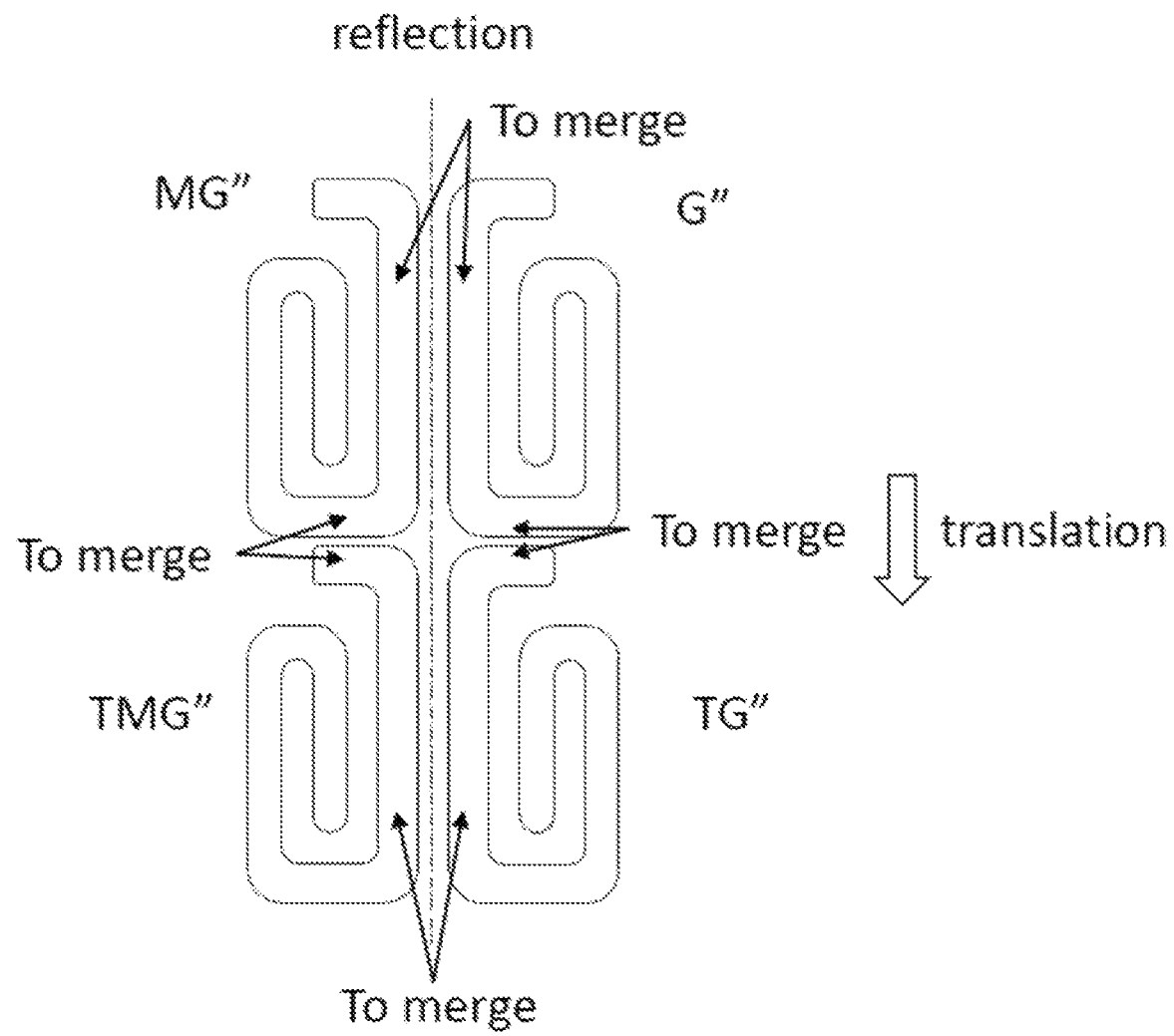

FIG. 4B demonstrates the process of operating unit cell G" to form the chip design shown in FIG. 4A.

Figure 5A:
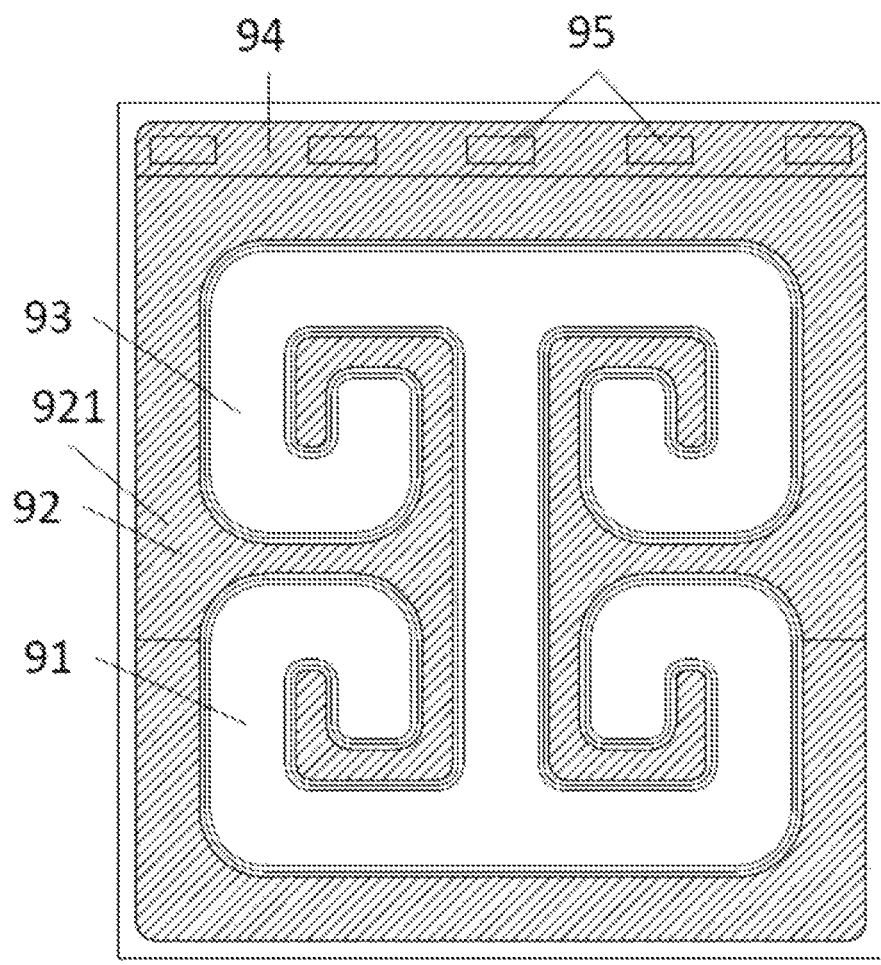

FIG. 5A illustrates a plan-view LED chip design, via operating an n-trough unit cell (G') through at least two of the three operators: translation, reflection and rotation.

Figure 5B:
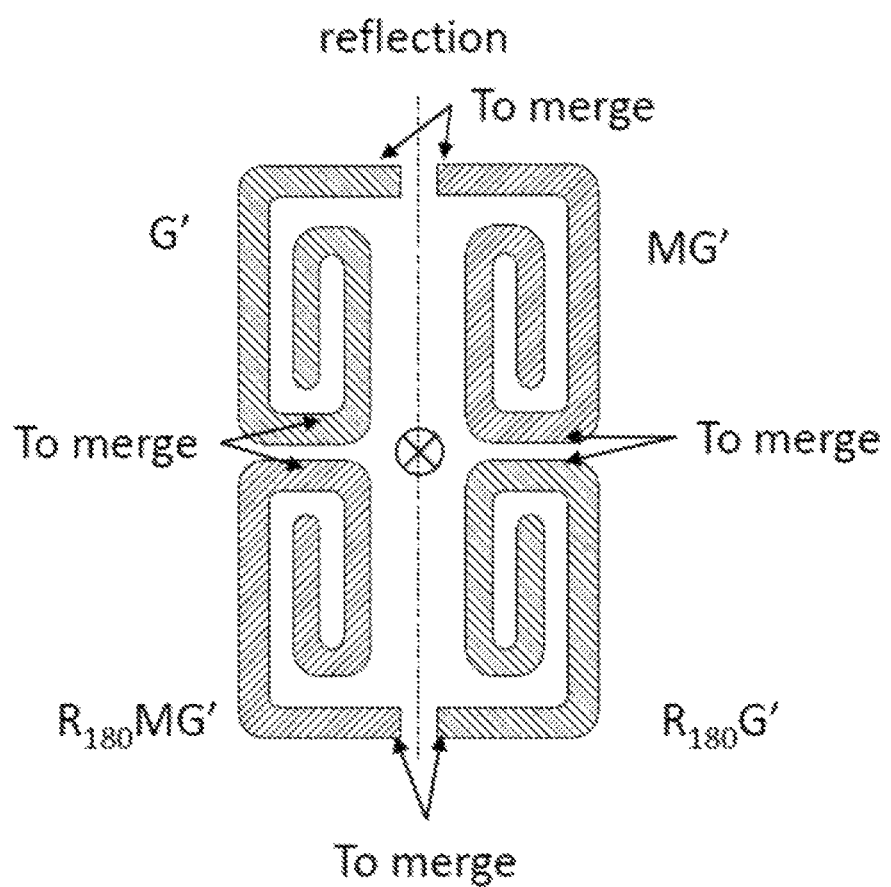

FIG. 5B demonstrates the process of operating n-trough unit cell G' to form the chip design shown in FIG. 5A.

Figure 6A:
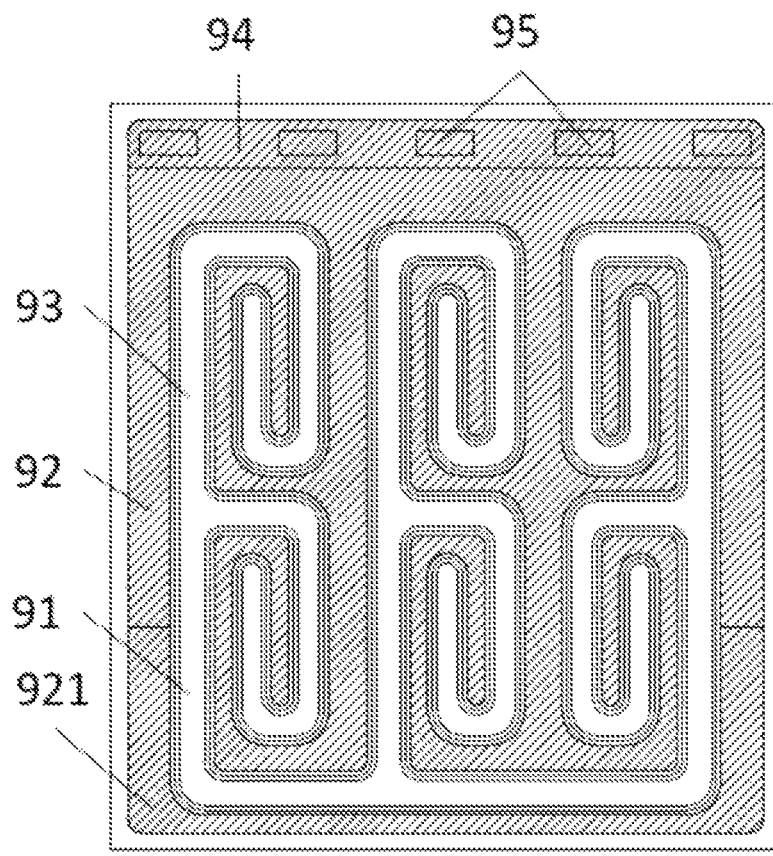

FIG. 6A illustrates a plan-view LED chip design, via operating a p-mesa unit cell $G^2$ through at least two of the three operators: translation, reflection and rotation.

Figure 6B:
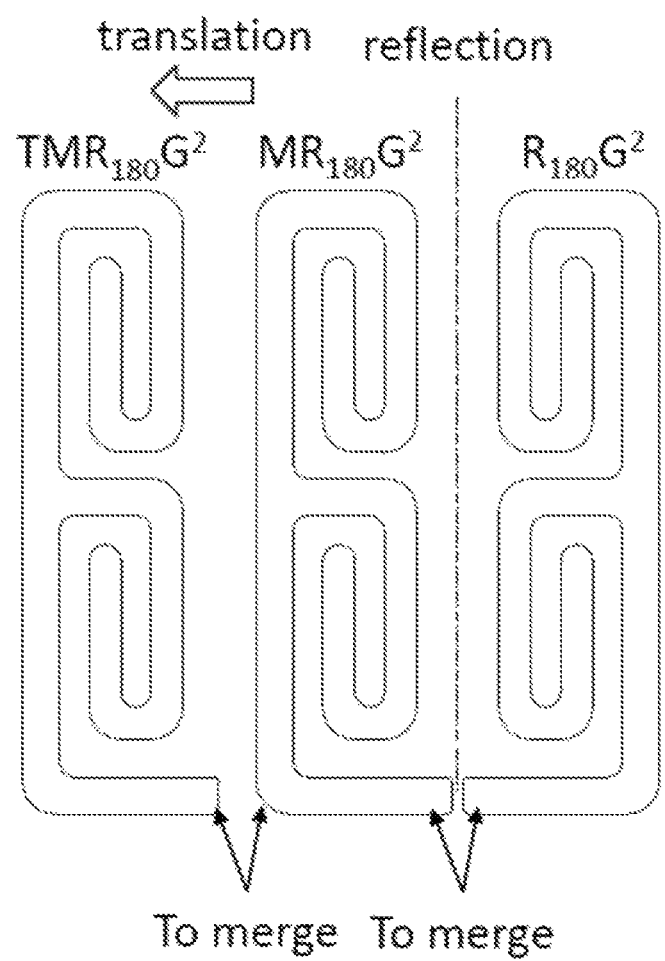

FIG. 6B demonstrates the process of operating unit cell $G^2$ to form the chip design shown in FIG. 6A.

Figure 7A:
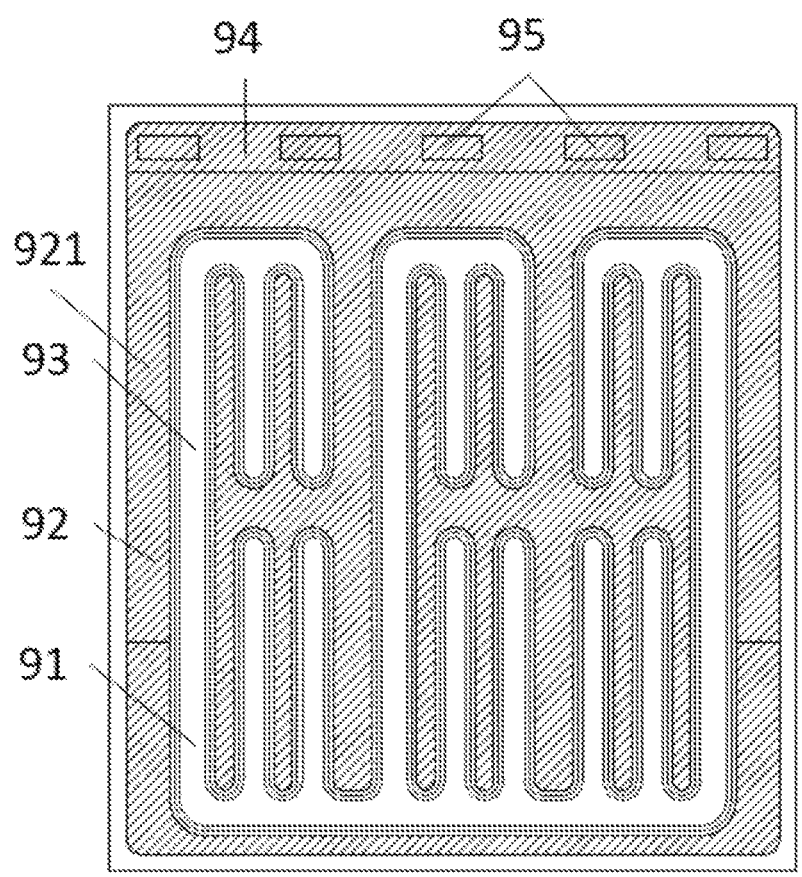

FIG. 7A illustrates a plan-view LED chip design, via operating a p-mesa unit cell $C^2$ through at least two of the three operators: translation, reflection and rotation.

Figure 7B:
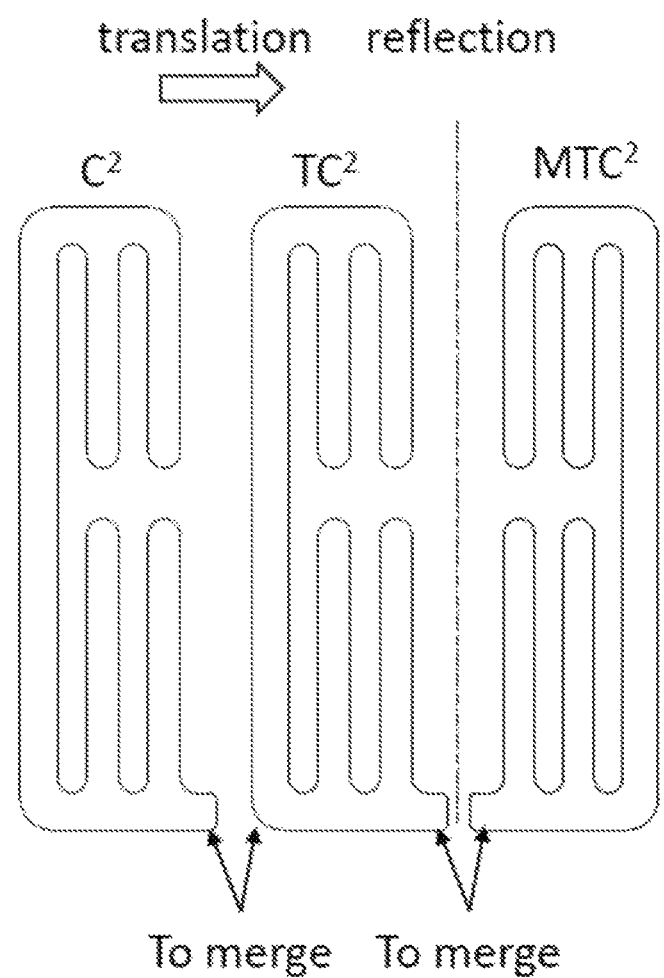

FIG. 7B demonstrates the process of operating unit cell $C^2$ to form the chip design shown in FIG. 7A.

Figure 8A:
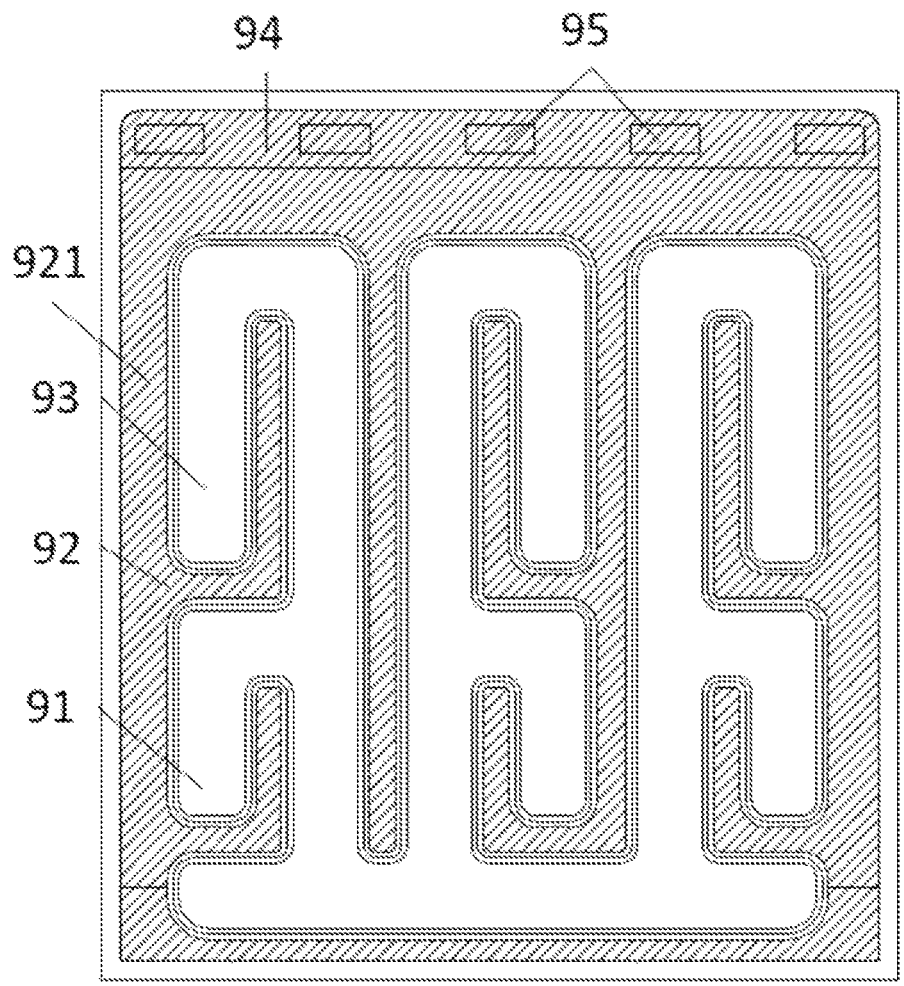

FIG. 8A illustrates a plan-view LED chip design, via operating a p-mesa unit cell E through at least two of the three operators: translation, reflection and rotation.

Figure 8B:
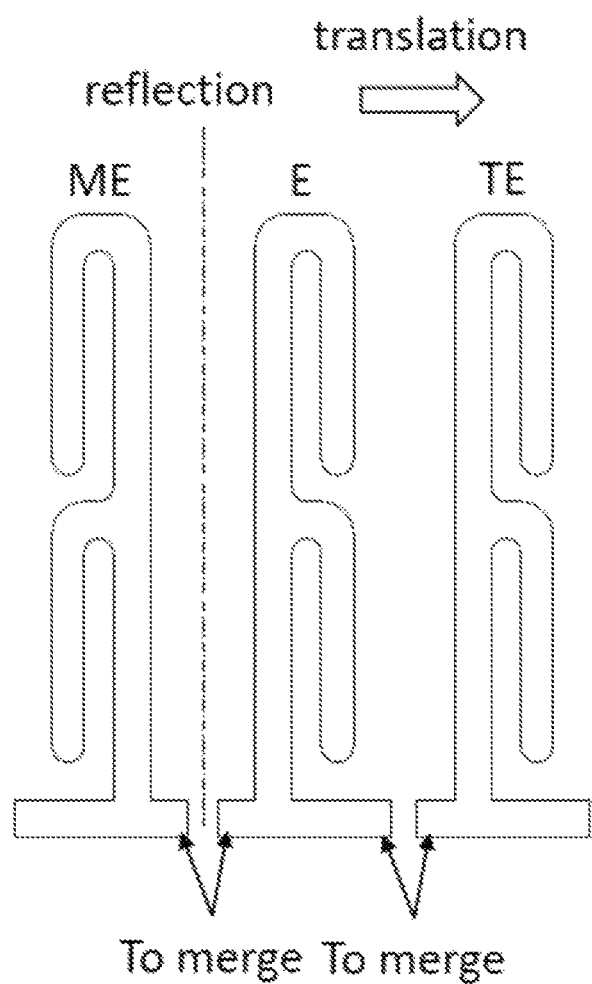

FIG. 8B demonstrates the process of operating unit cell E to form the chip design shown in FIG. 8A.

Figure 9A:
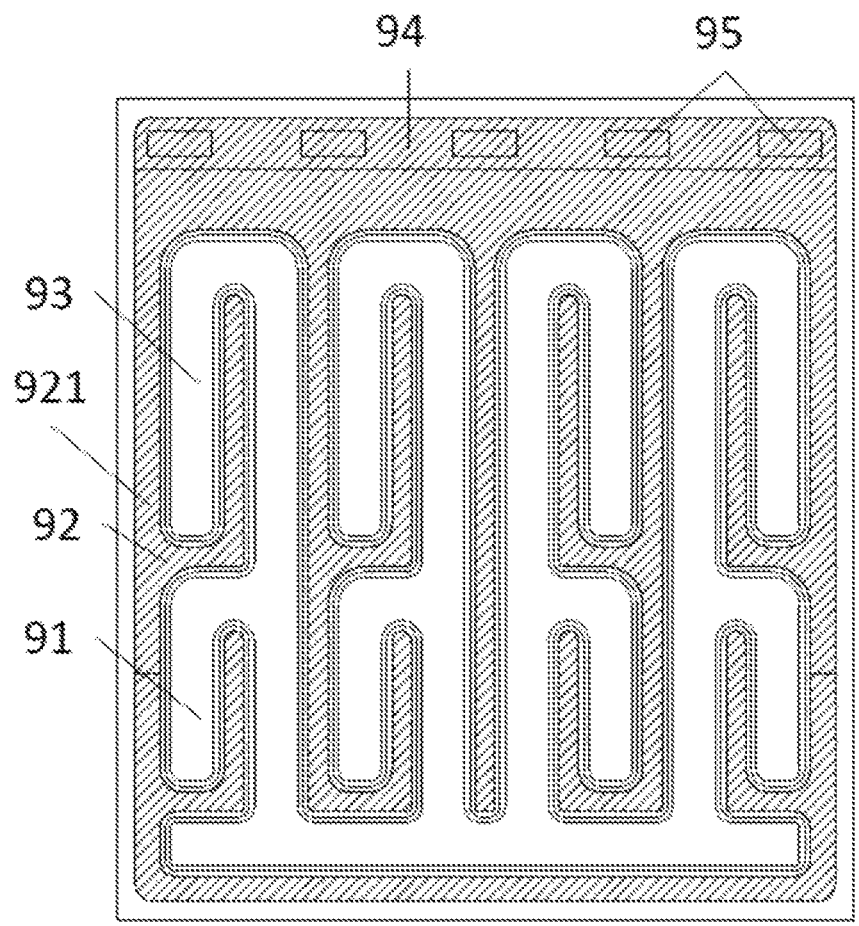

FIG. 9A illustrates a plan-view LED chip design, via operating a p-mesa unit cell E through at least two of the three operators: translation, reflection and rotation.

Figure 9B:
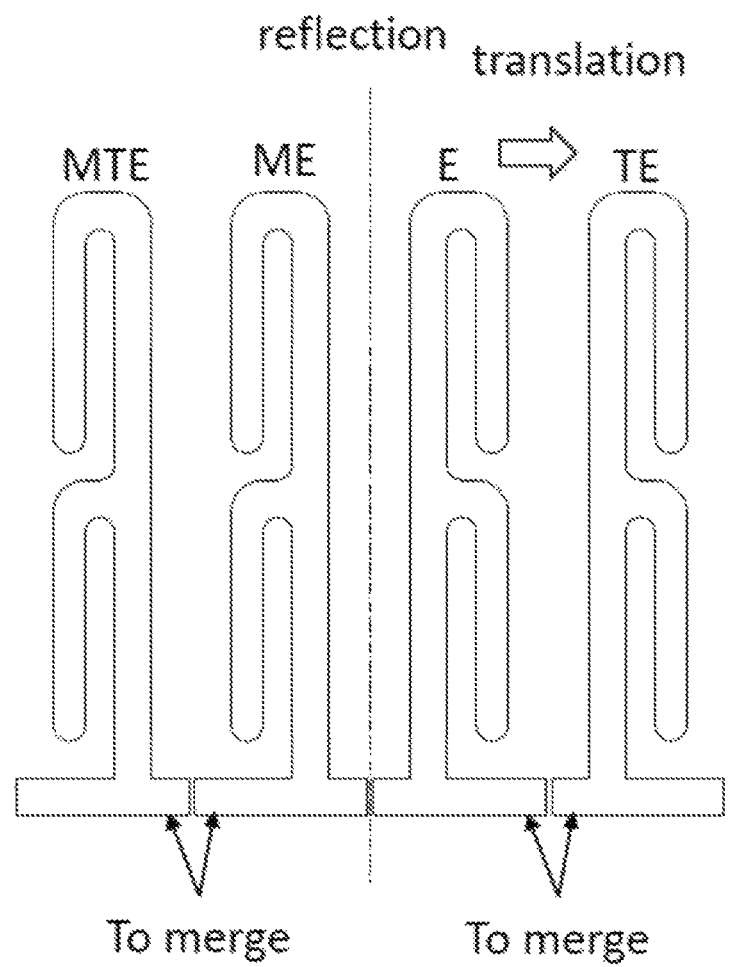

FIG. 9B demonstrates the process of operating unit cell E to form the chip design shown in FIG. 9A.

Figure 10A:
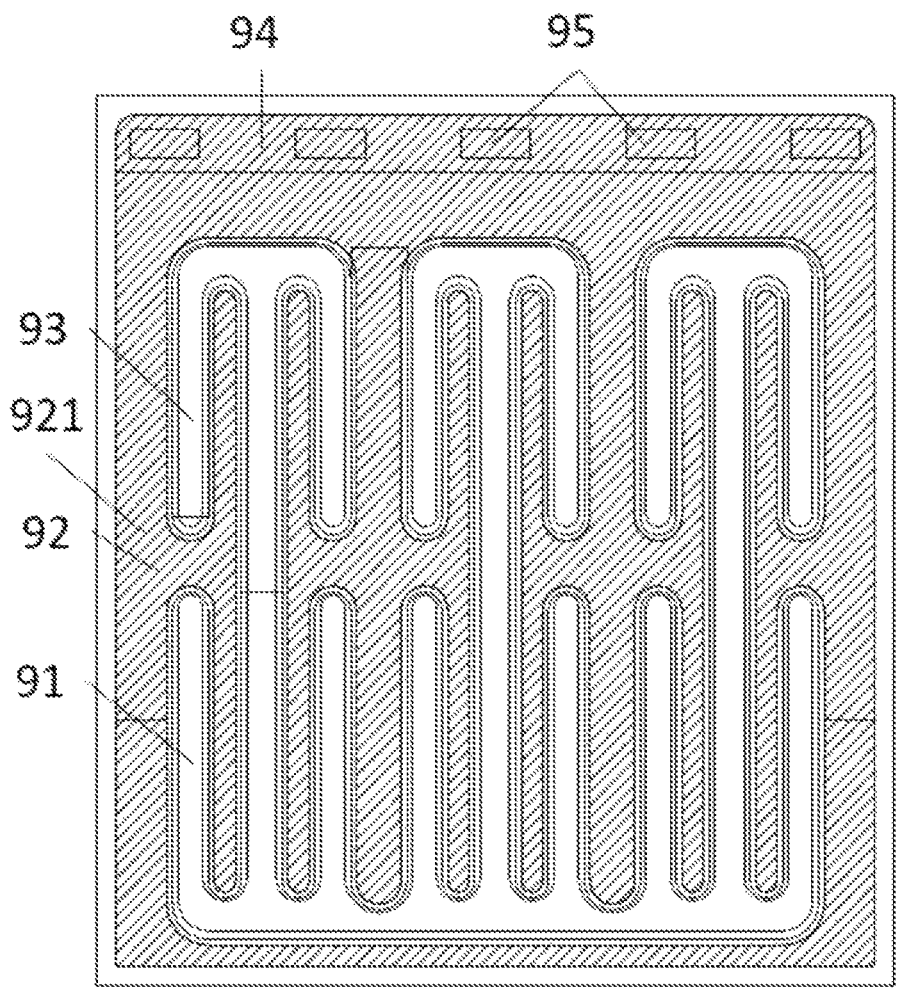

FIG. 10A illustrates a plan-view LED chip design, via operating a p-mesa unit cell $m^2$ through at least two of the three operators: translation, reflection and rotation.

Figure 10B:
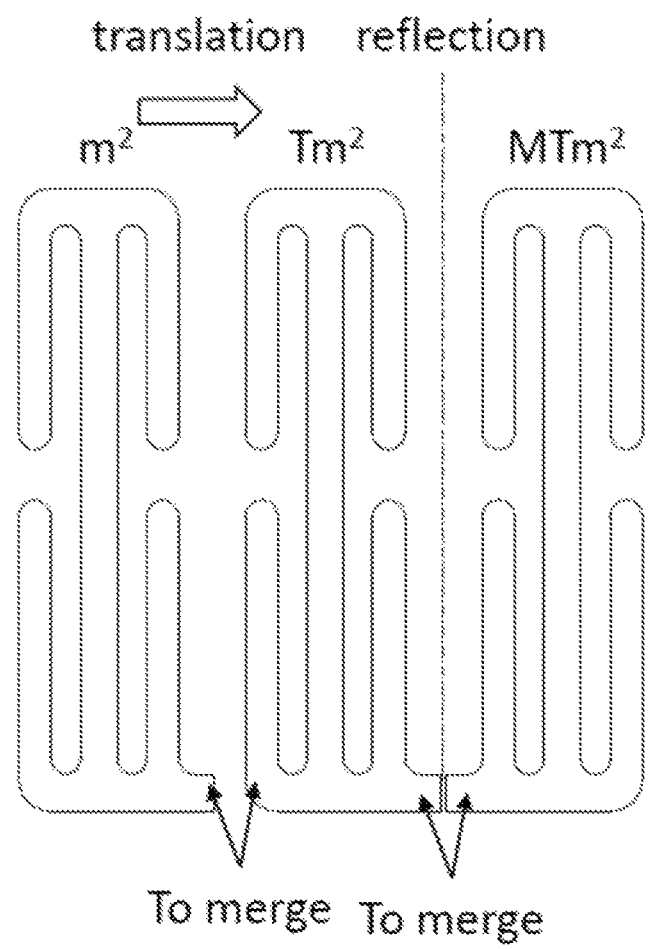

FIG. 10B demonstrates the process of operating unit cell $m^2$ to form the chip design shown in FIG. 10A.

Figure 11A:
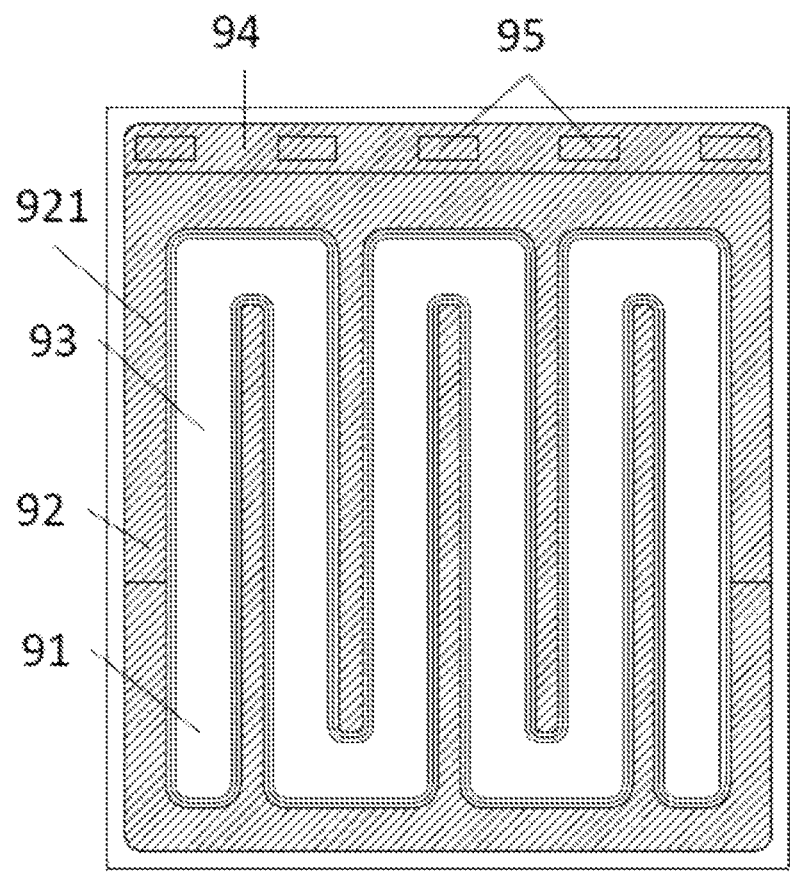

FIG. 11A illustrates a plan-view LED chip design, via operating a p-mesa unit cell q through at least two of the three operators: translation, reflection and rotation.

Figure 11B:
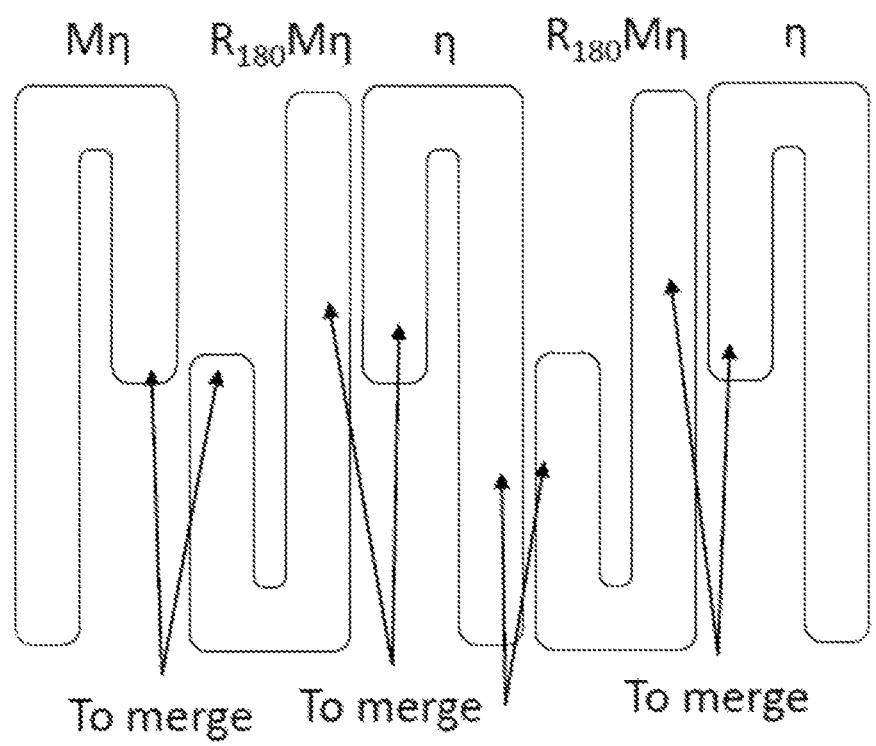

FIG. 11B demonstrates the process of operating unit cell q to form the chip design shown in FIG. 11A.

Figure 12A:
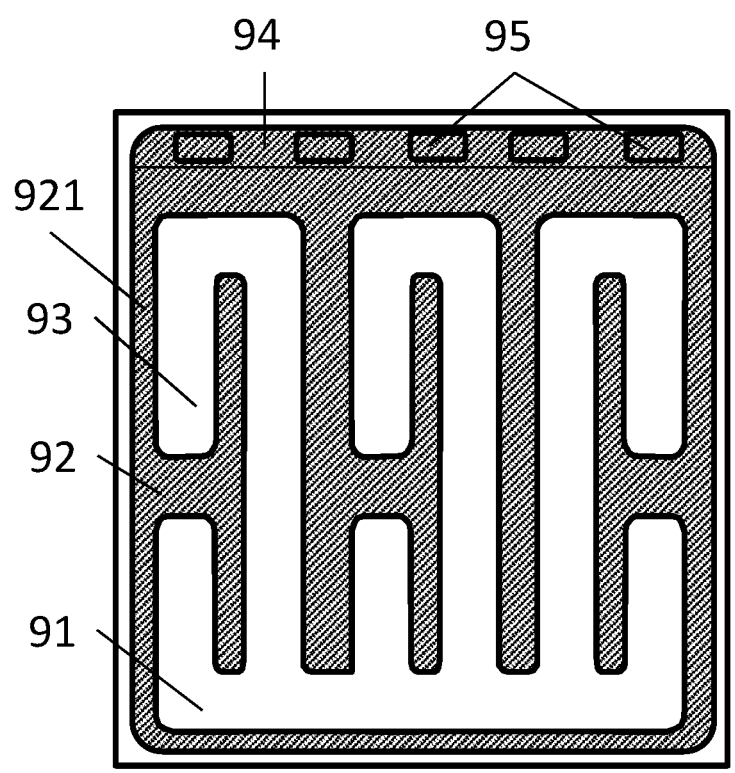

FIG. 12A illustrates a plan-view LED chip design, via operating a p-mesa unit cell C through at least two of the three operators: translation, reflection and rotation.

Figure 12B:
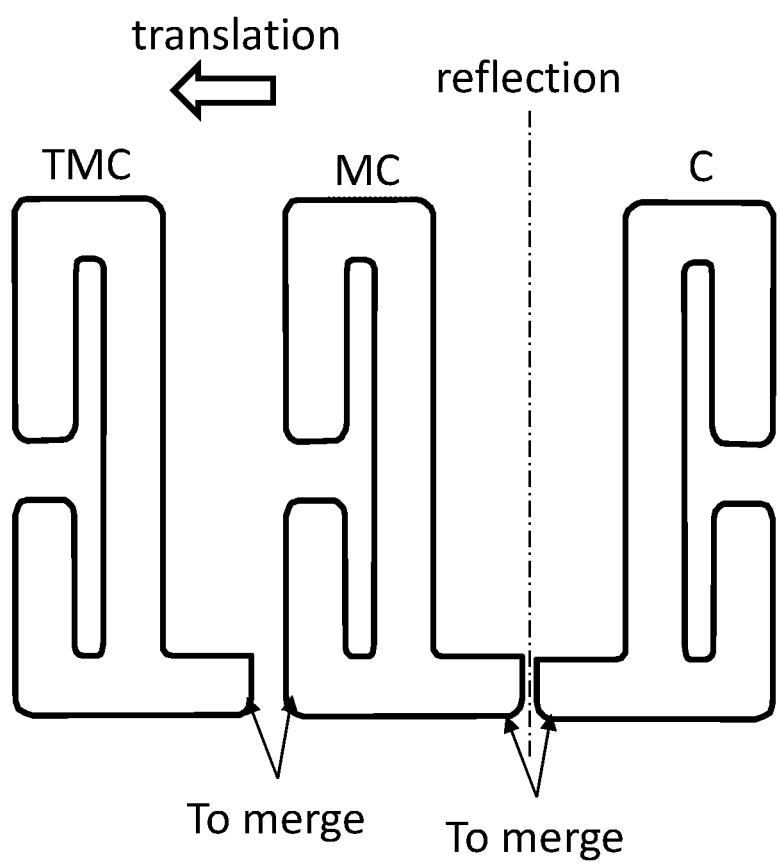

FIG. 12B demonstrates the process of operating unit cell C to form the chip design shown in FIG. 12A.

Figure 13:
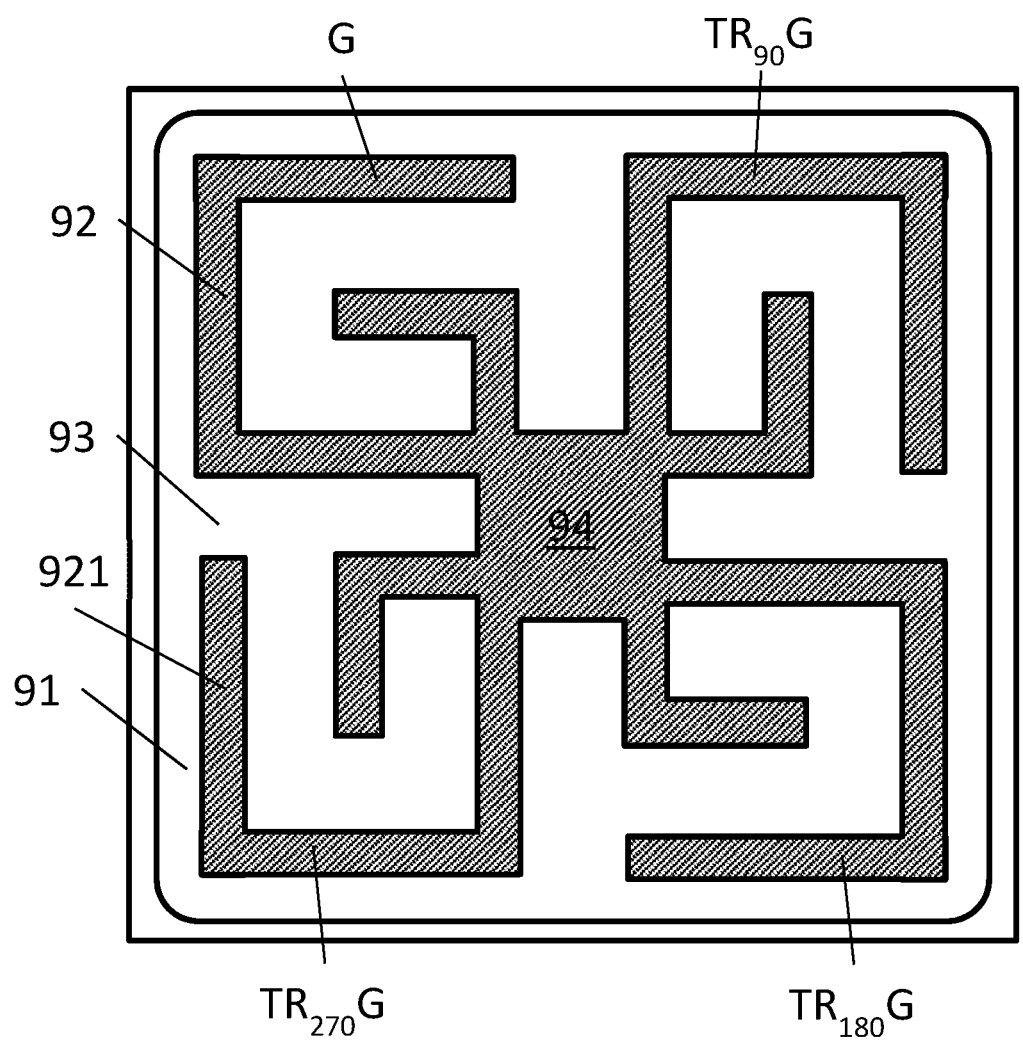

FIG. 13 illustrates a plan-view LED chip design, via operating an n-trough unit cell (G) through at least two of the three operators: translation, reflection and rotation.

Figure 14A:
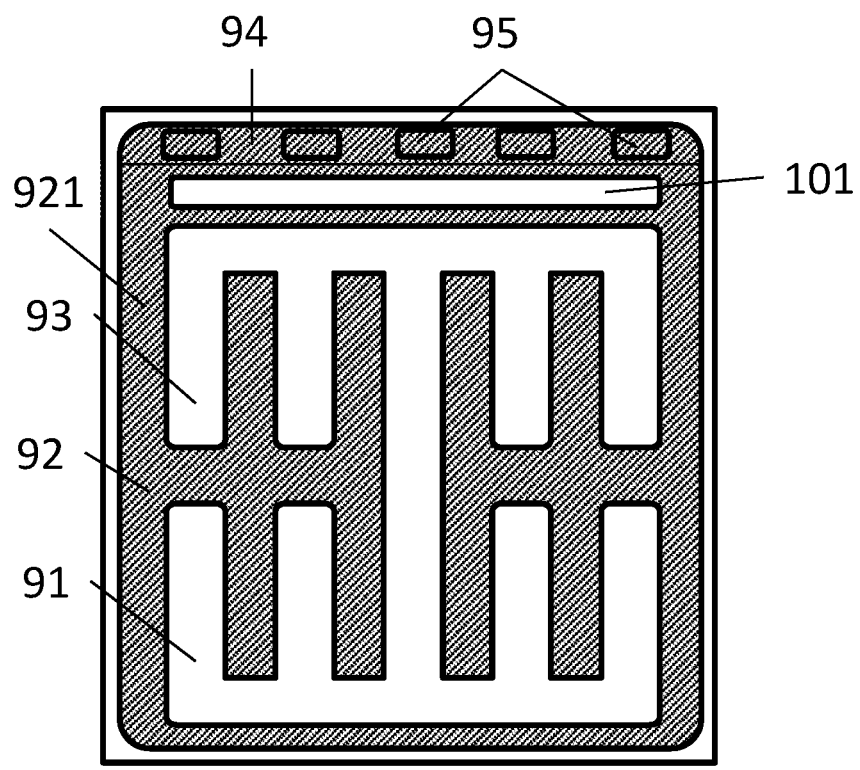

FIG. 14A illustrates a plan-view LED chip design, via operating a p-mesa unit cell E' through at least two of the three operators: translation, reflection and rotation.

Figure 14B:
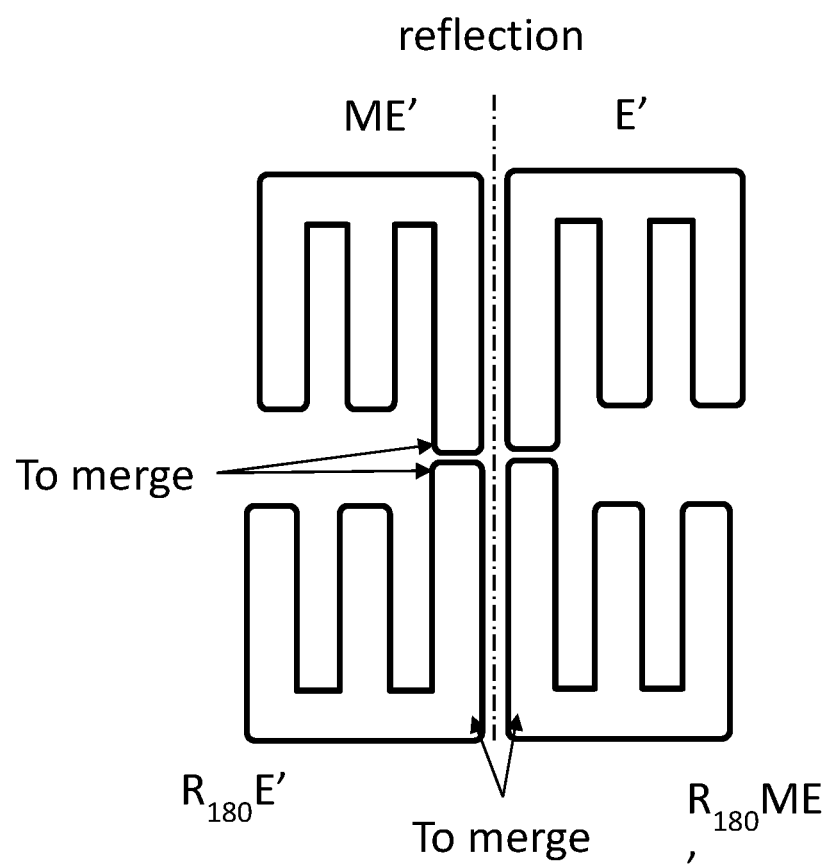

FIG. 14B demonstrates the process of operating unit cell E' to form the chip design shown in FIG. 14A.

5. DETAILED DESCRIPTION OF EMBODIMENTS

Throughout the specification, the term group III nitride in general refers to metal nitride with cations selecting from group IIIA of the periodic table of the elements. That is to say, III-nitride includes AlN, GaN, InN and their ternary (AlGaN, InGaN, InAlN) and quaternary (AlInGaN) alloys. In this specification, a quaternary can be reduced to a ternary for simplicity if one of the group III elements is significantly small so that its existence does not affect the intended function of a layer made of such material. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. Group III nitride may also include small amount of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with $(1-x-y-z) \leq 10\%$.

As mentioned previously, lateral LEDs with limited n-type conduction have current crowding issue and current crowding can severely limits an LED's lifetime because of localized high-current density. According to Guo and Schubert (X. Guo, and E. F. Schubert, Current crowding in GaN/InGaN light emitting diodes on insulating substrates, J. Appl. Phys. 90, 4191 (2001)), the crowded current density is described by equation: $J(x)=J(0)e^{-x/L}$, where $J(x)$ is current density at x, distanced from n-ohmic contact 51', and L is current spreading length $$L = \sqrt{\frac{(\rho_c + \rho_p t_p)t_n}{\rho_n}},$$

where $\rho_c$, $\rho_p$, and $\rho_n$ are p-type specific contact resistance, resistivity of p-type layer, and resistivity of n-type layer, respectively; $t_n$ and $t_p$ are thicknesses of n- and p-type layers, respectively. Assuming the PN junction area is A, current spreading length, L, can be rewritten as:

$$L = t_n \sqrt{\frac{(\rho_c + \rho_p t_p)/A}{\rho_n t_n/A}} = t_n \sqrt{\frac{R_p}{R_n}},$$

where $R_p$ and $R_n$ are respectively p-side and n-side resistances.

As seen, current spreading length is the distance where current density drops to 1/e (~36.8%) of its original value. Increasing the thickness and conductivity of n-AlGaN structure 20' can result in better current spreading effect.

For a nitride blue or UVC LED, p-side is usually more heavily doped compared to n-side, and the PN junction depletion region is mostly within MQW active-region and n-side. That means $R_p$ is fixed, but $R_n$ can be dependent on injection, so can be current spreading length. When a PN junction is within small injection region (current-voltage (IV) curve not in the linear region), $R_n$ can be very large, as it contains resistance contribution from PN junction depletion region, leading to very small current spreading length hence severely crowded current at the p-mesa edge. This means that a chip designed to mediate current crowding at high-injections may still suffer from severe current crowding at small injections. On the contrary, if a chip is designed to have much reduced current crowding at small injections it will be of even less current crowding effect at high injections.

One aspect of the present disclosure is to provide LED chip designs of greatly reduced current crowding effect at small injections. For this purpose, the present disclosure provides LED chip designs with increased p-mesa perimeter while maintaining the desired p-mesa area. LEDs designed according to the present disclosure will be of superior lifetime, as well as better light extraction efficiency, as longer perimeter of p-mesa allowing for more laterally travelling light to be extracted out of the LED chip.

Figure 1A:
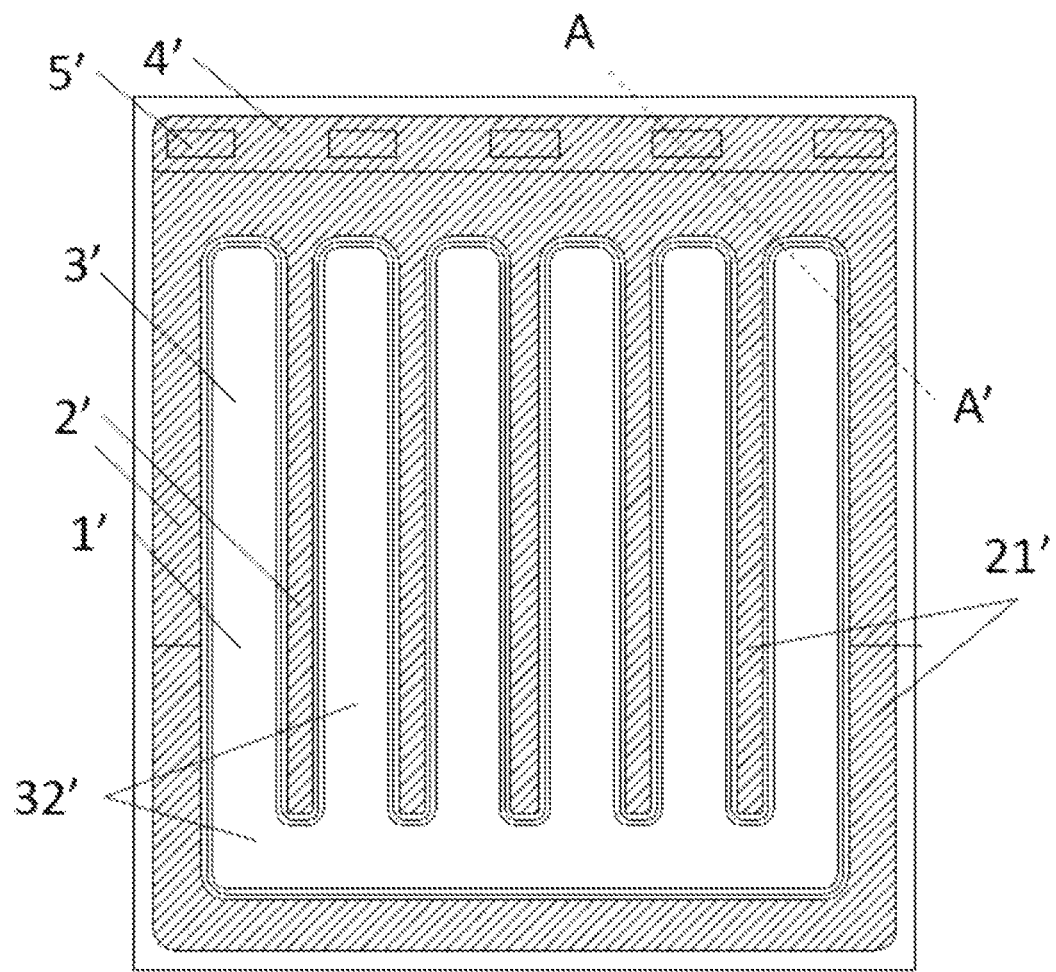
FIG. 1A shows a plan-view illustration of interdigital n-, and p-electrode design for a prior art LED.
Figure 1B:
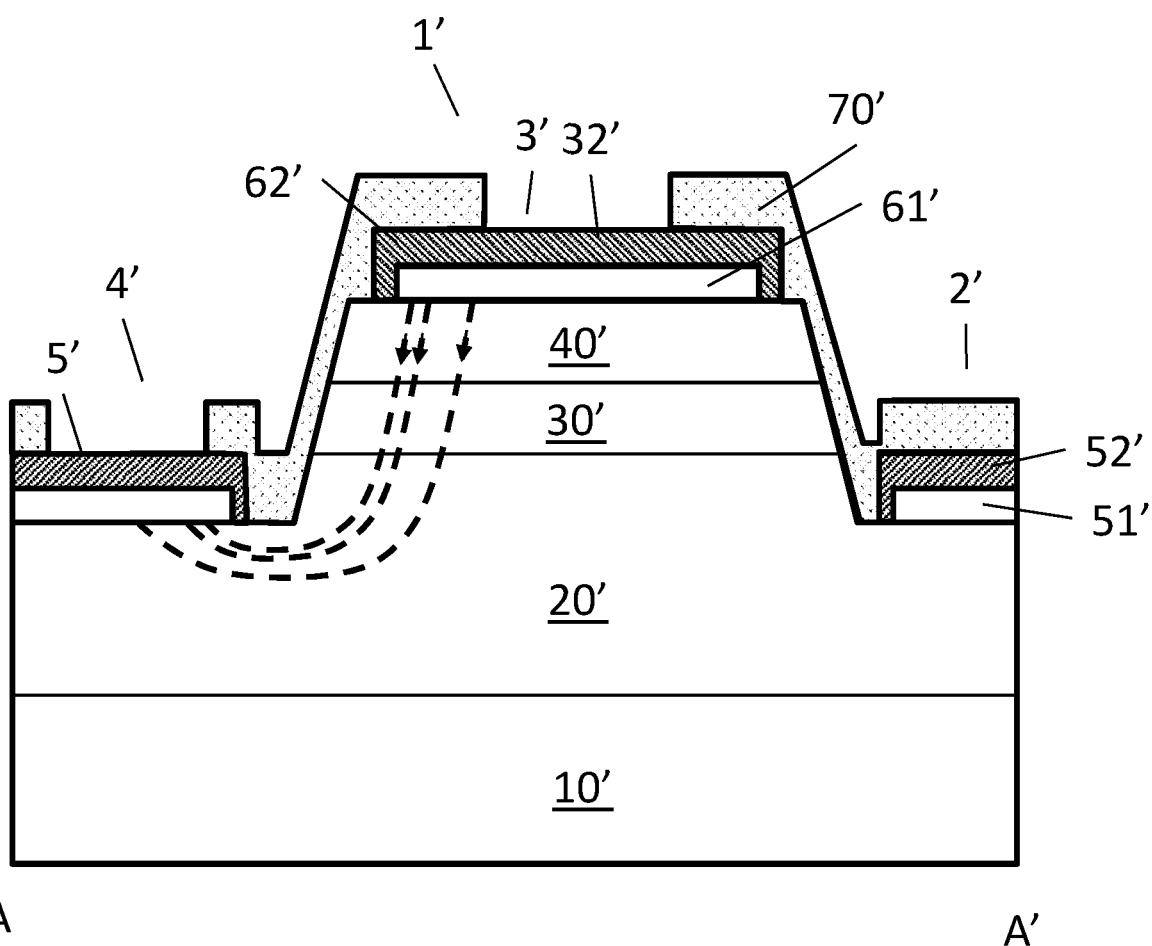
FIG. 1B illustrates the cross-sectional view of the device structure taken from the AA' cut shown in FIG. 1A.

To facilitate the following discussion and description in this specification, it is defined that n-contact metal includes n-ohmic contact (e.g. 51' in FIG. 1B) and thick n-metal (e.g. 52' in FIG. 1B), and p-contact metal includes p-ohmic contact (e.g. 61' in FIG. 1B) and thick p-metal (e.g. 62' in FIG. 1B). Further, n-contact metal portion surrounding p-mesa (e.g. 1' in FIG. 1B, 91 in FIG. 4A) is defined as n-electrode (e.g. 21' in FIG. 1A, 921 in FIG. 4A), and n-contact metal portion not surrounding p-mesa is called n-contact pad (4' in FIG. 1A, 94 in FIGS. 4A-14A). P-contact metal portion surrounding n-trough (e.g. 2' in FIG. 1A, 92 in FIG. 4A) is defined as p-electrode (e.g. 32' in FIG. 1A, 932 in FIG. 4A). P-contact pad, exposed p-contact pad (3', 93) and p-electrode (32', 932) can be substantially overlapping or the same, so that the whole p-contact metal (pad and electrode) is equipotential. The exposed n- and p-contact pads are for direct contact (bonding) to an external power source.

As well known, nitride light emitting devices such as light emitting diodes (LEDs) and laser diodes, commonly adopt a laminate structure containing a quantum well active region, an n-type nitride structure for injecting electrons into the active region, and a p-type nitride structure on the other side of the active region for injecting holes into the active region. For lateral injection LEDs, n-ohmic contact is formed on n-type nitride structure. To selectively expose n-type nitride structure so as to form n-trough, a lithographic technique is used to define an area of exposure (for etching) and a complementary area of protection (against etching), and an etch process is used to remove p-type nitride structure, MQW active-region, and part of n-type nitride structure in the defined area of exposure. Besides forming an n-trough to expose n-nitride structure, this selective etching process also simultaneously defines and forms a p-mesa in the area of protection. Since the light-emitting area of a lateral injection LED is totally contained in its p-mesa, the p-mesa can thus be called as light-emitting mesa. The n-trough can surround the p-mesa, or vice versa, therefore, the n-trough and the p-mesa are two different topological spaces. According to one aspect of the present disclosure, both the n-trough and the p-mesa are preferably to be a path-connected space. Topologically speaking, a path-connected space is characterized by the fact that there is at least one continuous path within the space to connect any two different points within the space. Physically speaking, a path-connected space can be made equipotential.

According to another aspect of the present disclosure, a unit cell of a path-connected two-dimensional space can be used (as template or mask) to form a larger path-connected space for p-mesa or n-trough, through at least two of the three linear operations including translation, rotation, and reflection. Moreover, the unit cell is preferably to be a two-dimensional path-connected space with genus equal to zero. Generally speaking, genus of a space is the number of "holes" or "voids" it has.

Illustrated in FIGS. 2A-2J are some embodiments of such unit cells according to one aspect of the present disclosure, named as $m^2$, E, E', $C^2$, $G^2$, G''', G', C, G, and q unit cell, respectively. Take the $m^2$ (double m) unit cell in FIG. 2A for example, it is easy to notice that $m^2$ unit cell is a zero-genus path-connected two-dimensional space. In fact, this is true for all the embodiment unit cells shown in FIGS. 2A-2J.

As shown in FIG. 2A, the double m unit cell has a shape of two "m"s connected through the finger in the middle and the other 4 fingers which have the same length are parallel with the connected middle finger. The bottom beam of the double m unit cell (the bottom beam is parallel with the upper beam of the double m unit cell and substantially perpendicular to the connected middle finger) extends laterally beyond the right-side finger.

As shown in FIG. 2B, the E unit cell has a shape of "E" with the upper finger and the middle finger (which has the same length with the upper finger) being bended downwards 90°, so that each of the bended upper finger and middle finger has a lateral portion and a vertical portion. The vertical portion of the bended upper finger is aligned with the vertical portion of the bended middle ginger and is parallel with the vertical beam of the E unit cell. The bottom finger beam extends laterally beyond the vertical beam and the vertical portion of the upper finger and the middle finger.

As shown in FIG. 2C, the E' unit cell has a shape of "E" being rotated 90° clockwise and with the finger in the left hand side being longer than the other two fingers (which have the same length).

As shown in FIG. 2D, the double C unit cell has a shape similar to that of the double m unit cell except that, instead of the middle fingers, the fingers in the left hand side are connected, where the unconnected 4 fingers have the same length.

As shown in FIG. 2E, the double G unit cell has a shape of "E" with the middle finger and the bottom finger (which has the same length as the middle finger) being bended upwards 90°, then bended laterally 90° towards the vertical beam of the "E", and then bended downwards 90°, respectively, so that each of the bended middle finger and bottom finger has an upper lateral portion and a lower lateral portion running horizontally, and a first vertical portion and a second vertical portion located between the first vertical portion and the vertical beam. The upper finger laterally extends beyond the first vertical portion of the upper finger and the middle finger. The bended middle finger and bottom finger have identical shape.

Figure 2F:
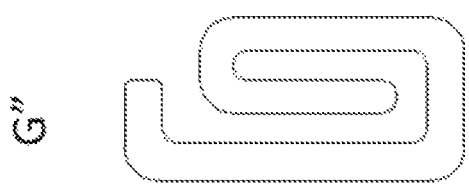
FIG. 2F shows a plan-view of a p-mesa unit cell (G") according to an embodiment of the present disclosure.

As shown in FIG. 2F, the G" unit cell has a spiral shape with a first horizontal portion, a second horizontal portion, a third horizontal portion, a first vertical portion, a second vertical portion, and a third vertical portion, where the first horizontal portion connects to the first vertical portion, the first vertical portion connects to the second horizontal portion, the second horizontal portion connects to the second vertical portion, the second vertical portion connects to the third horizontal portion, and the third horizontal portion connects to the third vertical portion in sequence. The first horizontal portion is located at the top and extends rightwards not beyond the second vertical portion, where the third vertical portion is parallel with and located between the first and second vertical portions, and the third horizontal portion is parallel with and located between the first and second horizontal portions.

Figure 2G:
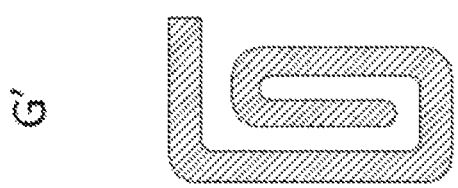
FIG. 2G shows a plan-view of an n-trough unit cell (G') according to an embodiment of the present disclosure.

As shown in FIG. 2G, the G' unit cell has a spiral shape similar to that of the G" unit cell except that the first horizontal portion extends rightwards beyond the second vertical portion.

Figure 2H:
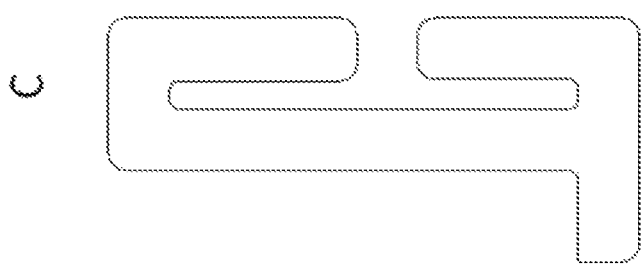
FIG. 2H shows a plan-view of a p-mesa unit cell (C) according to an embodiment of the present disclosure.

As shown in FIG. 2H, the C unit cell has a vertical beam, the top end of the vertical beam connects to the left end of a top horizontal beam, the right end of the top horizontal beam connects to an upper vertical finger pointing downwards. The bottom end of the vertical beam connects to the middle portion of a bottom beam. The right end of the bottom beam connects to the lower end of a lower vertical finger pointing upwards. The upper vertical finger and the lower vertical finger have substantially the same length, with a gap in-between.

Figure 2I:
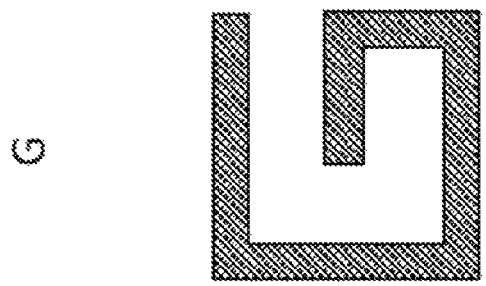
FIG. 2I shows a plan-view of an n-trough unit cell (G) according to an embodiment of the present disclosure.

As shown in FIG. 2I, the G unit cell has a spiral shape resembling English letter G, with a first horizontal portion, a second horizontal portion, a third horizontal portion, a first vertical portion, and a second vertical portion, where the first horizontal portion connects to the first vertical portion, the first vertical portion connects to the second horizontal portion, the second horizontal portion connects to the second vertical portion, and the second vertical portion connects to the third horizontal portion in sequence. The first horizontal portion is located at the top and extends rightwards, and the right end of the first horizontal portion is vertically aligned with the second vertical portion, where the first vertical portion is parallel with the second vertical portion, and the third horizontal portion is parallel with and located between the first and second horizontal portions.

Figure 2J:
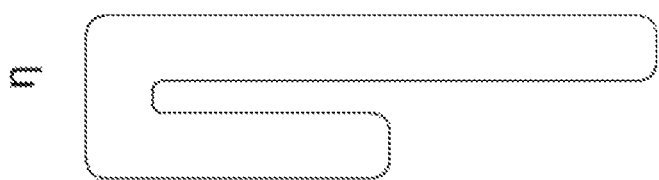
FIG. 2J shows a plan-view of a p-mesa unit cell according (q) to an embodiment of the present disclosure.

As shown in FIG. 2J, the q unit cell is of a hook shape, having a first vertical beam, a second vertical beam, and a horizontal beam. The top end of the first vertical beam connects to the right end of the horizontal beam, and the left end of the horizontal beam connects to the top end of the second vertical beam. The length of the first vertical beam is longer, for example, doubles that of the second vertical beam.

The unit cells shown in FIGS. 2E, 2F, 2G, and 2I, namely, unit cells $G^2$, G", G' and G, all having a spiral shape resembling English letter G, are thus grouped into G group unit cells.

Figure 3A:
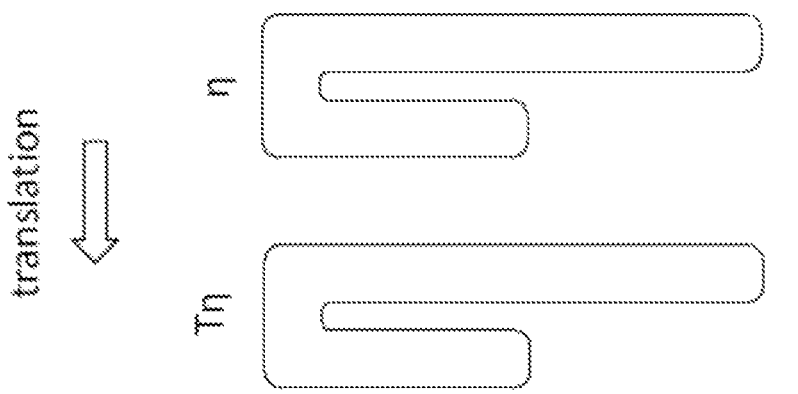
FIG. 3A shows a translation operation of a unit cell.
Figure 3B:
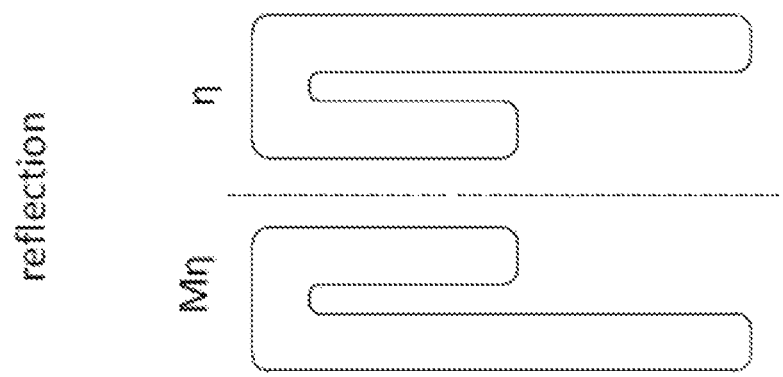
FIG. 3B shows a reflection operation of a unit cell.
Figure 3C:
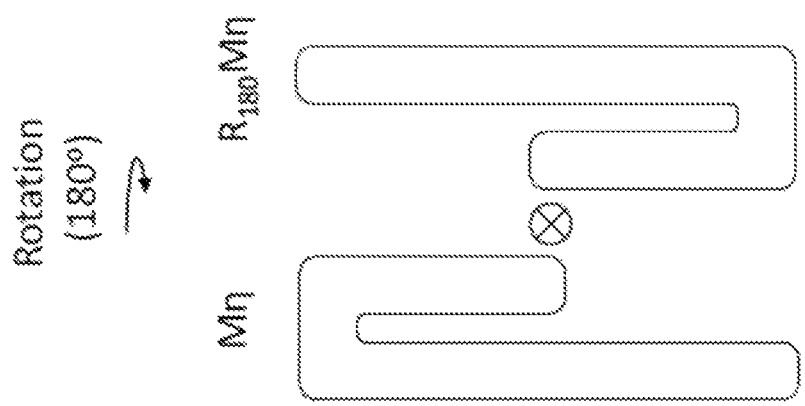
FIG. 3C shows a rotation operation of a unit cell.

Three linear operations can be applied to a unit cell to obtain its rigid transformations via translation, rotation, and reflection. Shown in FIG. 3A is an illustration of translating (laterally moving) unit cell q to its translation Tq, through the translation operator T. Translation can be operated along any direction to any translated distance. Reflection operator M (short for Mirror) mirrors a unit cell along a reflecting surface, as is shown in FIG. 3B for η→Mη. Rotation operator R rotates a unit cell around an axis for a certain angle. For example, $R_{90}$ and $R_{180}$ rotates a unit cell about an axis for 90 and 180 degree, respectively. Shown in FIG. 3C is the $R_{180}$ operation of Mη→$R_{180}$Mη, around the axis ⊗ perpendicular to the page.

A unit cell and its rigid transformations can be merged together to obtain a desired pattern or design of a mask, which can be used as a lithographic mask for formation of the n-trough and the p-mesa of a light-emitting device. Merging is a translation operation, via translating a unit cell and its transformations to allow for the closest neighboring parallel portions to overlap, so as to formed path-connected zero-genus overlapped zones.

Illustrated in FIG. 4A is a plan-view LED chip design according to one aspect of the present disclosure. The LED chip comprises a p-mesa 91 and an n-trough 92. P-electrode 932 and (exposed) p-contact pad 93 are conformally formed on the top surface of p-mesa 91, withdrawal of a few microns (1-8 μm for example) from the edge of p-mesa 91. N-electrode 921 on the other hand conformally forms on the top surface of n-trough 92, withdrawal of a few microns (1-8 μm for example) from the edge of n-trough too. It is noted that the withdrawal distance from the mesa or trough edge is to avoid p-electrode and n-electrode short circuit. Also, without further repeating the description to the other embodiments shown below, it is understood that p-contact metal including p-electrode 932 and p-contact pad 93 is formed on the top surface of p-mesa 91, and n-contact metal including n-electrode 921 and n-contact pad 94 is formed on the top surface of n-trough 92.

Specifically, n-contact pad 94 in FIG. 4A is formed on the n-trough 92 portion which does not surround p-mesa 91 (located at one side of p-mesa), and is dedicated for electrical connection to external power source. According to another aspect of the present disclosure, part of n-contact pad 94 can also be formed on top of balance mesas 95. Balance mesas 95 locate in the n-trough 92 portion which does not surround p-mesa 91 (located at one side of p-mesa), shaped as small mesas during formation of n-trough 92 without removal of any epitaxial layers in the mesas 95 zone so that mesas 95 are of the same height as that of p-mesa 91. Balance mesas 95 are of much smaller size as compared to p-mesa 91. Mesa 95 can be of rectangular, circular, or squared shape with dimension of a few tens of microns to 100 microns. Balance mesas 95 are uniformly distributed within a zone covered by n-contact pad 94, providing mechanical support to level chip surface when chip is flip-chip bond to a submount or printed circuit board (PCB). The number of balance mesas 95 can be related to chip size, ranging from 3 to 7.

According to another aspect of the present disclosure, the design of p-mesa 91 of FIG. 4A can be accomplished via operating a p-mesa unit cell through at least two of the three operations/transformations: translation, reflection and rotation. The operations are illustrated in FIG. 4B. Firstly take a G" unit cell as shown in FIG. 2F; secondly mirror it to the left to get its reflection MG"; thirdly do translation to G" and MG" to get TG" and TMG", respectively; and fourthly, allow the closest neighboring and parallel sides (marked by arrows in FIG. 4B) of G", MG", TG" and TMG" to merge (via translation) to form an overlapped zero-genus zone, so that merged G", MG", TG" and TMG" form the shape of p-mesa 91 shown in FIG. 4A. The merged zone (here only one) is a path-connected space with genus equal to zero. After these operations, path-connected p-mesa 91 and n-trough 92 are formed, and p-mesa 91 is totally surrounded by n-trough 92. Path-connectedness of p-mesa 91 and n-trough 92 is important as this allows p-electrode 932 and n-electrode 921 to be at their respective equipotential status. The width of p-mesa 91 is substantially constant everywhere, critical for uniform current spreading from n-electrode 921 to p-electrode 932. Compared to the prior art designs, for a given p-mesa area, p-mesa 91 designed according to the present disclosure because of the spiral nature possesses larger perimeter, allowing for better light extraction and better current spreading even at lower injections. Also, the near field and far field light-emission patterns are more uniform because p-mesa 91 is more symmetric. Further, as seen from FIG. 4A, the genera of p-mesa 91 and n-trough 92 are zero and 5, respectively (taking into consideration of the 4 balance mesas used in the n-contact pad zone, however the genus for the n-contact metal is only one).

Similarly, a p-mesa can also be constructed via operating an n-trough unit cell. Shown in FIG. 5A is a plan-view LED chip design, formed via operating an n-trough unit cell (the G' unit cell as shown in FIG. 2G) by reflection and rotation. The operations are illustrated in FIG. 5B. Firstly take a G' unit cell; secondly mirror it to the right to get its reflection MG'; thirdly do a 180-degree rotation along the center axis ⊗ perpendicular to the page to get $R_{180}G'$ and $R_{180}MG'$, respectively; and fourthly, allow the closest neighboring and parallel sides (marked by arrows in FIG. 5B) of G', MG', $R_{180}G'$ and $R_{180}MG'$ to merge (via translation). The merged zones (here four merged zones) are a path-connected space with genus equal to zero. The merged G', MG', $R_{180}G'$ and $R_{180}MG'$ form the shape of n-electrode 921 and n-trough 92 in FIG. 5A. After these operations, path-connected p-mesa 91 and n-trough 92 are formed, and p-mesa 91 is totally surrounded by n-trough 92. Path-connectedness of p-mesa 91 and n-trough 92 is important as this allows p-electrode 932 and n-electrode 921 to be at their respective equipotential status. The width of p-mesa 91 is substantially constant everywhere, critical for uniform current spreading from n-electrode 921 to p-electrode 932. Compared to the prior art designs, for a given p-mesa area, p-mesa 91 designed according to the present disclosure because of the spiral nature possesses larger perimeter, allowing for better light extraction and better current spreading even at lower injections. Also, the near field and far field light-emission patterns are more uniform because p-mesa 91 is more symmetric. Mesa 91 in FIG. 5A can also be formed via G', MG' and their respective (downwards) reflections (MG' and MMG'). As seen from FIG. 5A, the genera of p-mesa 91 and n-trough 92 are zero and 6, respectively (taking into consideration of the 5 balance mesas used in the n-contact pad zone, however the genus for the n-contact metal is only one).

Shown in FIG. 6A is an LED chip design where p-mesa 91 is constructed via operating a p-mesa unit cell (the $G^2$ unit cell as shown in FIG. 2E) through rotation, reflection and translation. The operations are illustrated in FIG. 6B. Firstly perform a $R_{180}$ operation to the $G^2$ unit cell and obtain $R_{180}G^2$; secondly mirror $R_{180}G^2$ to the left to get its reflection $MR_{180}G^2$; thirdly do translation to $MR_{180}G^2$ to get $TMR_{180}G^2$; and fourthly, allow the closest neighboring and parallel sides of $R_{180}G^2$, $MR_{180}G^2$, and $TMR_{180}G^2$ to merge (via translation). After these operations, path-connected p-mesa 91 and n-trough 92 are formed, and p-mesa 91 is totally surrounded by n-trough 92. Path-connectedness of p-mesa 91 and n-trough 92 is important as this allows p-electrode 932 and n-electrode 921 to be at their respective equipotential status. The width of p-mesa 91 is substantially constant everywhere, critical for uniform current spreading from n-electrode 921 to p-electrode 932. As seen from FIG. 6A, the genera of p-mesa 91 and n-trough 92 are zero and six, respectively (taking into consideration of the 5 balance mesas used in the n-contact pad zone, however the genus for the n-contact metal zone is only one).

Shown in FIG. 7A is an LED chip design where p-mesa 91 is formed via operating a p-mesa unit cell (the $C^2$ unit cell as shown in FIG. 2D) through translation and reflection. The operations are illustrated in FIG. 7B. Firstly take a $C^2$ unit cell; secondly, translate unit cell $C^2$ to the right and get its translation $TC^2$; thirdly, mirror $TC^2$ to the right to get its reflection $MTC^2$; and fourthly, allow the closest neighboring and parallel sides of $C^2$, $TC^2$, and $MTC^2$ to merge (via translation). After these operations, path-connected p-mesa 91 and n-trough 92 are formed, and p-mesa 91 is totally surrounded by n-trough 92. Path-connectedness of p-mesa 91 and n-trough 92 is important as this allows p-electrode 932 and n-electrode 921 to be at their respective equipotential status. The width of p-mesa 91 is substantially constant everywhere, critical for uniform current spreading from n-electrode 921 to p-electrode 932. As seen from FIG. 7A, the genera of p-mesa 91 and n-trough 92 are zero and six, respectively (taking into consideration of the 5 balance mesas used in the n-contact pad zone, however the genus for the n-contact metal zone is only one).

Still shown in FIG. 8A is an LED chip design where p-mesa 91 is formed via operating a p-mesa unit cell (the E unit cell as shown in FIG. 2B) through translation and reflection. The operations are illustrated in FIG. 8B. Firstly take an E unit cell; secondly, translate unit cell E to the right and get its translation TE; thirdly, mirror E to the left to get its reflection ME; and fourthly, allow the closest neighboring and parallel sides of ME, E, and TE to merge (via translation). After these operations, path-connected p-mesa 91 and n-trough 92 are formed and p-mesa 91 is totally surrounded by n-trough 92. Path-connectedness of p-mesa 91 and n-trough 92 is important as this allows p-electrode 932 and n-electrode 921 to be at their respective equipotential status. The width of p-mesa 91 is substantially constant everywhere, critical for uniform current spreading from n-electrode 921 to p-electrode 932. As seen from FIG. 8A, the genera of p-mesa 91 and n-trough 92 are zero and six, respectively (taking into consideration of the 5 balance mesas used in the n-contact pad zone, however the genus for the n-contact metal zone is only one).

Still shown in FIG. 9A is an LED chip design where p-mesa 91 is formed via operating a p-mesa unit cell (the E unit cell as shown in FIG. 2B) through translation and reflection. The operations are illustrated in FIG. 9B. Firstly take an E unit cell; secondly, translate unit cell E to the right and get its translation TE; thirdly, mirror E and TE to the left to get reflections ME and MTE, respectively; and fourthly, allow the closest neighboring and parallel sides of MTE, ME, E and TE to merge (via translation). After these operations, path-connected p-mesa 91 and n-trough 92 are formed and p-mesa 91 is totally surrounded by n-trough 92. Path-connectedness of p-mesa 91 and n-trough 92 is important as this allows p-electrode 932 and n-electrode 921 to be at their respective equipotential status. The width of p-mesa 91 is substantially constant everywhere, critical for uniform current spreading from n-electrode 921 to p-electrode 932. As seen from FIG. 9A, the genera of p-mesa 91 and n-trough 92 are zero and six, respectively (taking into consideration of the 5 balance mesas used in the n-contact pad zone, however the genus for the n-contact metal zone is only one).

Still shown in FIG. 10A is an LED chip design where p-mesa 91 is formed via operating a p-mesa unit cell (the $m^2$ unit cell as shown in FIG. 2A) through translation and reflection. The operations are illustrated in FIG. 10B. Firstly take an $m^2$ unit cell; secondly, translate unit cell $m^2$ to the right and get its translation $Tm^2$; thirdly, mirror $Tm^2$ to the right to get reflection $MTm^2$; and fourthly, allow the closest neighboring and parallel sides of $m^2$, $Tm^2$, and $MTm^2$ to merge (via translation). After these operations, path-connected p-mesa 91 and n-trough 92 are formed and p-mesa 91 is totally surrounded by n-trough 92. Path-connectedness of p-mesa 91 and n-trough 92 is important as this allows p-electrode 932 and n-electrode 921 to be at their respective equipotential status. The width of p-mesa 91 is substantially constant everywhere, critical for uniform current spreading from n-electrode 921 to p-electrode 932. As seen from FIG. 10A, the genera of p-mesa 91 and n-trough 92 are zero and six, respectively (taking into consideration of the 5 balance mesas used in the n-contact pad zone, however the genus for the n-contact metal zone is only one).

Still shown in FIG. 11A is an LED chip design where p-mesa 91 is formed via operating a p-mesa unit cell (the η unit cell as shown in FIG. 2J) through translation, rotation and reflection. The operations are illustrated in FIG. 11B. Firstly take two η unit cells, a reflection of η (to the left Mη), and two 180-degree rotations of Mη($R_{180}$Mη); secondly, arrange the unit cells in order (from left to right): Mη, $R_{180}$Mη, η, $R_{180}$Mη, and η; and thirdly, allow the closest neighboring and parallel sides of Mη, $R_{180}$Mη, η, $R_{180}$Mη, and η to merge (via translation). After these operations, path-connected p-mesa 91 and n-trough 92 are formed and p-mesa 91 is totally surrounded by n-trough 92. Path-connectedness of p-mesa 91 and n-trough 92 is important as this allows p-electrode 932 and n-electrode 921 to be at their respective equipotential status. The width of p-mesa 91 is substantially constant everywhere, critical for uniform current spreading from n-electrode 921 to p-electrode 932. As seen from FIG. 11A, the genera of p-mesa 91 and n-trough 92 are zero and six, respectively (taking into consideration of the 5 balance mesas used in the n-contact pad zone, however the genus for the n-contact metal zone is only one).

Still shown in FIG. 12A is an LED chip design where p-mesa 91 is formed via operating a p-mesa unit cell (the C unit cell as shown in FIG. 2H) through translation and reflection. The operations are illustrated in FIG. 12B. Firstly take a C unit cell; secondly, mirror unit cell C to the left and get its reflection MC; thirdly, translate MC to the left to get translation TMC; and fourthly, allow the closest neighboring and parallel sides of C, MC, and TMC to merge (via translation). After these operations, path-connected p-mesa 91 and n-trough 92 are formed and p-mesa 91 is totally surrounded by n-trough 92. Path-connectedness of p-mesa 91 and n-trough 92 is important as this allows p-electrode 932 and n-electrode 921 to be at their respective equipotential status. The width of p-mesa 91 is substantially constant everywhere, critical for uniform current spreading from n-electrode 921 to p-electrode 932. As seen from FIG. 12A, the genera of p-mesa 91 and n-trough 92 are zero and six, respectively (taking into consideration of the 5 balance mesas used in the n-contact pad zone, however the genus for the n-contact metal zone is only one).

Still shown in FIG. 13 is an LED chip design where p-mesa 91 is formed via operating an n-trough unit cell (the unit cell G as shown in FIG. 2I) through rotations and translations. An n-trough unit cell G, and three of its rotated and translated transformations, $TR_{90}G$, $TR_{180}G$, and $TR_{270}G$ are distributed uniformly around the center of the chip, allowing the closest 4 neighboring corners of G, $TR_{90}G$, $TR_{180}G$, and $TR_{270}G$ to merge to form an area for n-contact pad 94. After these operations, path-connected p-mesa 91 and n-trough 92 are formed. Compared to the prior art designs, for a given p-mesa area, p-mesa 91 designed according to the present disclosure because of the spiral nature possesses larger perimeter, allowing for better light extraction and better current spreading even at lower injections. Also, the near field and far field light-emission patterns are more uniform because p-mesa 91 is more symmetric. As seen from FIG. 13, the genera of p-mesa 91 and n-trough 92 are both zero, since n-contact pad 94 is formed at the chip center, no balance mesa is needed in the n-contact pad area (although one in the center of n-contact pad area is allowable).

Still shown in FIG. 14A is an LED chip design where p-mesa 91 is constructed via operating a p-mesa unit cell (the unit cell E') through reflection and rotation. The operations are illustrated in FIG. 14B. Firstly take a p-mesa unit cell E'; secondly, mirror unit cell E' to the left and get its reflection ME'; thirdly, rotate E' and ME' 180 degree and get $R_{180}$E', $R_{180}$ME'; and fourthly, allow the closest neighboring and parallel sides of E', ME', $R_{180}$E', and $R_{180}$ME' to merge (via translation). After these operations, path-connected p-mesa 91 and n-trough 92 are formed and p-mesa 91 is totally surrounded by n-trough 92. Path-connectedness of p-mesa 91 and n-trough 92 is important as this allows p-electrode 932 and n-electrode 921 to be at their respective equipotential status. The width of p-mesa 91 is substantially constant everywhere, critical for uniform current spreading from n-electrode 921 to p-electrode 932. Mesa 91 in FIG. 14A can also be formed via E', ME' and their respective (downwards) reflections (ME' and MME'). Also, as seen in FIG. 14A, in-between n-contact pad 94 and p-mesa 91, preferably there is a mesa 101, which is structure-wise exactly the same as mesa 91, i.e., mesa 101 can be viewed as a part of mesa 91, however, they are not path-connected. Hence mesa 101 can be configured as a photodiode (PD). In operation, mesa 91 will be positively biased to n-contact pad 94 so that light is emitted from the light-emitting MQW active-region, and mesa 101 is not biased regarding to n-contact pad 94, so that a photo-induced voltage can be measured between mesa 101 and n-contact pad 94, or mesa 101 can be negatively biased regarding to n-contact pad 94 and a photocurrent can be measured through mesa 101. Mesa 101 therefore can be operated as a photodiode to interpret the optical output power of mesa 91. More details of mesa 101 acting as a photodiode can be seen from U.S. patent application Ser. No. 16/046,917, which is incorporated herewith by reference in its entirety. Therefore, as seen from FIG. 14A, the genera of p-mesa 91 and n-trough 92 are zero and seven, respectively (taking into consideration of mesa 101 and the 5 balance mesas used in the n-contact pad zone, however the genus for the n-contact metal zone is only two).

The defining of a unit cell and using the unit cell to make p-mesa according to the teachings given above enlarges p-mesa perimeter whiling maintaining the desired p-mesa area. This will reduce current crowding effect (especially at small injections) and increase light extraction efficiency. The p-mesas, or the light-emitting mesas, formed according to the present disclosure, especially these formed via operating the unit cells selected from the G group (unit cells $G^2$, $G''$, $G'$ and G), are of high degree of symmetry, able to deliver much uniform near field and far field emission patterns.

The present disclosure has been described using exemplary embodiments. However, it is to be understood that the scope of the present disclosure is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A light-emitting device comprising an n-semiconductor structure, a p-semiconductor structure and a light-emitting active-region sandwiched therebetween;

wherein an n-trough is formed to expose the n-semiconductor structure by removing a first portion of the p-semiconductor structure and the light-emitting active-region, and the n-trough surrounds a p-mesa which contains a second portion of the n-semiconductor structure, the p-semiconductor structure and the light-emitting active-region;

wherein the n-trough and the p-mesa are path-connected spaces and are formed via lithography and etching using a lithographic mask which is topologically constructed via merging a unit cell's at least two different transformations selected from the unit cell's translation transformation, rotation transformation, and reflection transformation;

wherein the merging is a translation operation, via translating the unit cell's transformations to allow for their closest neighboring parallel portions to overlap, so as to form path-connected zero genus overlapped zones.

2. The light-emitting device according to claim 1, wherein the unit cell is topologically a two-dimensional path-connected space with genus equal to zero.

3. The light-emitting device according to claim 1, wherein an n-contact metal is formed on a first portion of the n-semiconductor exposed in the n-trough and a p-contact metal is formed on the p-mesa.

4. The light-emitting device according to claim 3, wherein the n-contact metal contains an n-contact pad and the n-contact pad is used for forming electrical contact to an external power source.

5. The light-emitting device according to claim 4, wherein the n-contact pad is located at a side of the p-mesa.

6. The light-emitting device according to claim 4, wherein the n-contact pad is located at a center of the p-mesa.

7. The light-emitting device according to claim 5, wherein at least one balance mesa is formed within the n-contact pad and the balance mesa is of the same height as that of the p-mesa.

8. The light-emitting device according to claim 7, wherein the balance mesa contains the n-semiconductor structure, the p-semiconductor structure, the light-emitting active-region and the n-contact pad metal.

9. The light-emitting device according to claim 5, wherein another mesa is provided in-between the n-contact pad and the p-mesa.

10. The light-emitting device according to claim 9, said another mesa is a part of the p-mesa but is not path-connected to the p-mesa.

11. The light-emitting device according to claim 10, said another mesas functions as a photodiode to reflect optical output power of the p-mesa.

12. The light-emitting device according to claim 1, wherein the unit cell is selected from $m^2$, E, E', $C^2$, $G^2$, G'', G', C, G, and n unit cells.

13. The light-emitting device according to claim 1, wherein the unit cell is selected from the G group unit cells.

* * * * *